United States Patent
Wu et al.

(10) Patent No.: US 11,532,673 B2
(45) Date of Patent: Dec. 20, 2022

(54) DISPLAY PANEL, METHOD OF MANUFACTURING DISPLAY PANEL, AND MASK PLATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jianpeng Wu, Beijing (CN); Fengli Ji, Beijing (CN); Chang Luo, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 148 days.

(21) Appl. No.: 16/981,921

(22) PCT Filed: Apr. 17, 2020

(86) PCT No.: PCT/CN2020/085367
§ 371 (c)(1),
(2) Date: Sep. 17, 2020

(87) PCT Pub. No.: WO2020/233300
PCT Pub. Date: Nov. 26, 2020

(65) Prior Publication Data
US 2021/0273028 A1 Sep. 2, 2021

(30) Foreign Application Priority Data
May 20, 2019 (CN) .......................... 201910418662.3

(51) Int. Cl.
*H01L 27/32* (2006.01)
*H01L 51/56* (2006.01)

(52) U.S. Cl.
CPC ...... *H01L 27/3218* (2013.01); *H01L 27/3216* (2013.01); *H01L 27/3246* (2013.01); *H01L 51/56* (2013.01); *H01L 2227/323* (2013.01)

(58) Field of Classification Search
CPC ........................................ H01L 27/3211–3218
See application file for complete search history.

(56) References Cited

U.S. PATENT DOCUMENTS 10,453,901 B2 * 10/2019 Kim ...................... H01L 51/525
10,686,018 B2 * 6/2020 Kim ..................... H01L 27/3262
(Continued)

FOREIGN PATENT DOCUMENTS

| CN | 104124265 A | * 10/2014 | ............. G09F 9/301 |
| CN | 104124265 A | 10/2014 | |

(Continued)

OTHER PUBLICATIONS

Machine translation, Liu, WIPO Pat. Pub. No. WO-2019218606-A1, translation date: Apr. 9, 2022, Espacenet, all pages. (Year: 2022).*

(Continued)

*Primary Examiner* — Victoria K. Hall
(74) *Attorney, Agent, or Firm* — Dinsmore & Shohl LLP

(57) ABSTRACT

The present disclosure relates to a display panel, a method of manufacturing a display panel, and a mask plate. A display panel includes a plurality of first light emitting layers configured to emit a light of a first color when excited; a plurality of second light emitting layers configured to emit a light of a second color when excited; and a plurality of third light emitting layers configured to emit a light of a third color when excited, wherein the first and second light (Continued)

emitting layers are alternately arranged in a first direction and a second direction crossing the first direction, and the third light emitting layers are arranged between the first and second light emitting layers, and each of the first and second light emitting layers includes chamfered corners, so that the first and second light emitting layers do not overlap.

13 Claims, 19 Drawing Sheets

(56) References Cited

U.S. PATENT DOCUMENTS

| | | | | |
|---|---|---|---|---|
| 11,004,905 | B2* | 5/2021 | Sun | H01L 51/5012 |
| 2013/0234917 | A1* | 9/2013 | Lee | H01L 27/3218 |
| | | | | 345/82 |
| 2014/0252321 | A1 | 9/2014 | Pyon et al. | |
| 2014/0319484 | A1* | 10/2014 | Kwon | H01L 27/326 |
| | | | | 257/40 |
| 2015/0102320 | A1* | 4/2015 | Jung | H01L 27/3218 |
| | | | | 257/40 |
| 2015/0200237 | A1* | 7/2015 | Yim | H01L 51/525 |
| | | | | 257/40 |
| 2016/0343284 | A1 | 11/2016 | Sun | |
| 2016/0351116 | A1 | 12/2016 | Sun | |
| 2018/0097043 | A1* | 4/2018 | Song | H01L 27/3218 |
| 2018/0342571 | A1* | 11/2018 | Kwon | H01L 27/3216 |
| 2019/0013495 | A1* | 1/2019 | Kim | H01L 51/5275 |
| 2019/0035859 | A1* | 1/2019 | Kang | G06V 40/1318 |
| 2019/0074329 | A1* | 3/2019 | Kim | H01L 51/525 |
| 2019/0131371 | A1* | 5/2019 | Yi | H01L 27/3265 |
| 2019/0165061 | A1* | 5/2019 | Jung | H01L 51/5253 |
| 2019/0237518 | A1* | 8/2019 | Sun | H01L 27/3218 |
| 2019/0237527 | A1* | 8/2019 | Lee | H01L 51/5228 |
| 2019/0251318 | A1* | 8/2019 | Jung | H01L 27/307 |
| 2019/0280061 | A1* | 9/2019 | Joo | H01L 27/3246 |
| 2019/0393275 | A1* | 12/2019 | Kim | H01L 27/3216 |
| 2020/0152713 | A1* | 5/2020 | Yim | G09G 3/3225 |
| 2020/0357877 | A1* | 11/2020 | Hyun | H01L 27/3246 |
| 2021/0280644 | A1* | 9/2021 | Du | C23C 14/042 |

FOREIGN PATENT DOCUMENTS

| | | | |
|---|---|---|---|
| CN | 104465714 A | | 3/2015 |
| CN | 104466007 A | | 3/2015 |
| CN | 207966988 U | | 10/2018 |
| CN | 208077981 U | | 11/2018 |
| CN | 109004010 A | | 12/2018 |
| CN | 208722880 U | | 4/2019 |
| WO | WO-2019218606 A1 * | 11/2019 | C23C 14/04 |

OTHER PUBLICATIONS

First Office Action dated Mar. 11, 2021, relating to CN Patent Application No. 201910418662.3.

* cited by examiner

DISPLAY PANEL, METHOD OF MANUFACTURING DISPLAY PANEL, AND MASK PLATE

CROSS REFERENCES TO RELATED APPLICATIONS

This application is a national stage of International Application No. PCT/CN2020/085367, filed on Apr. 17, 2020, which claims priority to Chinese Patent Application No. 201910418662.3 filed on May 20, 2019. Both of the aforementioned applications are hereby incorporated by reference in their entireties.

TECHNICAL FIELD

The present disclosure relates to the field of display technology, in particular to a display panel, a method of manufacturing a display panel, and a set of mask plates for manufacturing the display panel.

BACKGROUND

The evaporation of organic light emitting materials is a key part of the manufacturing process of organic light emitting diode (OLED) display panels. In the evaporation process, a super fine metal mask plate (FMM) with openings is used to obtain a high-resolution sub-pixel pattern. As the pixel density becomes higher and higher, ensuring the yield of OLED display panels becomes a challenge.

SUMMARY

According to a first aspect of the present disclosure, there is provided a display panel, including a plurality of first light emitting layers configured to emit a light of a first color when excited; a plurality of second light emitting layers configured to emit a light of a second color when excited; and a plurality of third light emitting layers configured to emit a light of a third color when excited, wherein the first light emitting layers and the second light emitting layers are alternately arranged in a first direction and a second direction crossing the first direction, and the third light emitting layers are arranged between the first light emitting layers and the second light emitting layers, and each of the first light emitting layers and the second light emitting layers includes corners, the corners are chamfered so that the first light emitting layer and the second light emitting layer do not overlap each other.

In some embodiments of the present disclosure, the corners include two first corners opposite to each other in the first direction and two second corners opposite to each other in the second direction.

In some embodiments of the present disclosure, one of the two first corners of each first light emitting layer is directly adjacent to one of the two first corners of the corresponding second light emitting layer, the corresponding second light emitting layer is directly adjacent to the first light emitting layer in the first direction, and wherein the distance between the first corner of the first light emitting layer and the first corner of the corresponding second light emitting layer is the minimum distance between the first light emitting layer and the corresponding second light emitting layer.

In some embodiments of the present disclosure, two sides of the first corner forming the first light emitting layer include respective straight portions, and respective imaginary extension lines of the straight portions intersect to form a first virtual corner, two sides of the first corner forming the corresponding second light emitting layer include respective straight portions, and respective imaginary extension lines of the straight portions intersect to form a second virtual corner, and the first virtual corner and the second virtual corner partially overlap.

In some embodiments of the present disclosure, one of the two second corners of each first light emitting layer is directly adjacent to one of the two second corners of the corresponding second light emitting layer, the corresponding second light emitting layer is directly adjacent to the first light emitting layer in the second direction, and a distance between the second corner of the first light emitting layer and the second corner of the corresponding second light emitting layer is the minimum distance between the first light emitting layer and the corresponding second light emitting layer.

In some embodiments of the present disclosure, two sides of the second corner forming the first light emitting layer include respective straight portions, and respective imaginary extension lines of the straight portions intersect to form a third virtual corner, two sides of the second corner forming the corresponding second light emitting layer include respective straight portions, and respective imaginary extension lines of the straight portions intersect to form a fourth virtual corner, and the third virtual corner and the fourth virtual corner partially overlap.

In some embodiments of the present disclosure, the first corner and the second corner of each first light emitting layer are flat chamfered or rounded chamfered with a first radius.

In some embodiments of the present disclosure, the first radius is greater than or equal to 10 um.

In some embodiments of the present disclosure, the first corner and the second corner of each second light emitting layer are flat chamfered or rounded chamfered with a second radius.

In some embodiments of the present disclosure, the second radius is greater than or equal to 10 um.

In some embodiments of the present disclosure, the display panel further comprising a pixel definition layer which includes a plurality of first openings covered by corresponding first light emitting layers, the plurality of first openings overlapping with corresponding regions of the corresponding first light emitting layers to define respective first light emitting zones of the plurality of first light emitting layers; a plurality of second openings covered by the corresponding second light emitting layers, the plurality of second openings overlapping with corresponding regions of the corresponding second light emitting layers to define respective second light emitting zones of the plurality of second light emitting layers; and a plurality of third openings covered by corresponding third light emitting layers, and the plurality of third openings overlap with corresponding regions of the corresponding third light emitting layers to define respective third light emitting zones of the plurality of third light emitting layers.

In some embodiments of the present disclosure, a distance from any point on an edge of each of the first corner and the second corner of each first light emitting layer to the corresponding first light emitting zone is greater than or equal to a misalignment tolerance value, and a distance from any point on the edge of each of the first corner and the second corner of each second light emitting layer to the corresponding second light emitting zone is greater than or equal to the misalignment tolerance value.

In some embodiments of the present disclosure, each third light emitting layer has a shape of a polygon with rounded corners, and each third light emitting zone has a shape conforming to the shape of the corresponding third light emitting layer, so that a minimum distance from any point on an edge of the corresponding third light emitting layer to a boundary of the third light emitting zone is substantially equal to the misalignment tolerance value.

In some embodiments of the present disclosure, the first light emitting layer, the second light emitting layer, and the third light emitting layer are arranged to form a plurality of repeating units repeatedly arranged in the first direction and the second direction, each repeating unit includes two first light emitting layers, two second light emitting layers and four third light emitting layers, wherein the two first light emitting layers are respectively arranged in the ith row and (j+2)th column, and the (i+2)th row and jth column, the two second light emitting layers are respectively arranged in the ith row and jth column, and the (i+2)th row and (j+2)th column, and the four third light emitting layers are respectively arranged in the (i+1)th row and (j+1)th column, (i+1)th row and (j+3)th column, (i+3)th row and (j+1)th column, and (i+3)th row and (j+3)th column, where i and j are integers greater than zero.

In some embodiments of the present disclosure, the first direction is substantially perpendicular to the second direction, each of the first light emitting layers has a shape obtained by chamfering each of four corners of a first square, and first and second diagonals of the first square are respectively parallel to the first and the second directions, each of the second light emitting layers has a shape obtained by chamfering each of four corners of a second square, and the first and second diagonals of the second square are respectively parallel to the first and the second directions, and each of the third light emitting layers has a shape obtained by rounding each of four corners of a rectangle, and a long side of the rectangle faces a side of the corresponding first light emitting layer directly adjacent to the third light emitting layer and is substantially parallel to the side of the corresponding first light emitting layer, and a short side of the rectangle faces a side of the corresponding second light emitting layer directly adjacent to the third light emitting layer and is substantially parallel to the side of the corresponding second light emitting layer.

In some embodiments of the present disclosure, a geometric center of each first light emitting layer and a geometric center of the corresponding second light emitting layer directly adjacent to the first light emitting layer in the first direction are located on a straight line parallel to the first direction, and the geometric center of each first light emitting layer and a geometric center of the corresponding second light emitting layer directly adjacent to the first light emitting layer in the second direction are located on a straight line parallel to the second direction.

According to a second aspect of the present disclosure, there is provided a method of manufacturing a display panel, including patterning a first conductive layer to form a plurality of first electrodes, wherein the first electrodes are arranged in an array in a first direction and a second direction crossing the first direction; forming a pixel defining layer on the patterned first conductive layer; patterning the pixel defining layer to form a plurality of openings respectively exposing the plurality of the first electrodes, wherein each opening exposes at least a part of the corresponding first electrode, and a first plurality of the first electrodes among the plurality of the first electrodes are respectively exposed by the first plurality of first openings among the plurality of the openings, and a second plurality of the first electrodes among the plurality of the first electrodes are respectively exposed by the second plurality of second openings among the plurality of the openings, and a third plurality of the first electrodes of the plurality of the first electrodes are respectively exposed by the third plurality of third openings of the plurality of the openings; forming a plurality of first light emitting layers respectively covering the first openings, a plurality of second light emitting layers respectively covering the second openings, and a plurality of third light emitting layers respectively covering the third openings; and forming a second conductive layer on the first light emitting layer, the second light emitting layer and the third light emitting layer, wherein the first light emitting layers and the second light emitting layers are alternately arranged in the first direction and the second direction, and each third light emitting layer is disposed between the first light emitting layer and the second light emitting layer, and each of the first light emitting layer and the second light emitting layer includes corners, and the corners are chamfered so that the first light emitting layer and the second light emitting layer do not overlap each other.

In some embodiments of the present disclosure, the corners include two first corners opposite to each other in the first direction and two second corners opposite to each other in the second direction.

According to a third aspect of the present disclosure, there is provided a set of mask plates for depositing organic light emitting materials during a process of manufacturing a display panel, including a first mask plate patterned to include an array of first holes, each first hole includes two chamfered corners opposite to each other in a first direction and two chamfered corners opposite to each other in a second direction crossing the first direction; and a second mask plate patterned to include an array of second holes, each second hole includes two chamfered corners opposite to each other in the first direction and two chamfered corners opposite to each other in the second direction, wherein the first holes and the second holes are respectively positioned in the first mask plate and the second mask plate so that when the first mask plate and the second mask plate are stacked and aligned with each other, the first holes and the second holes are alternately arranged in the first direction and the second direction and do not overlap each other.

In some embodiments of the present disclosure, each corner of each first hole is a flat chamfer or rounded with a first radius.

In some embodiments of the present disclosure, the first radius is greater than or equal to 10 um.

In some embodiments of the present disclosure, each corner of each second hole is a flat chamfer or rounded with a second radius.

In some embodiments of the present disclosure, the second radius is greater than or equal to 10 um.

In some embodiments of the present disclosure, the first and second holes are respectively positioned in the first mask plate and the second mask plate so that when the first mask plate and the second mask plate are stacked and aligned with each other, a geometric center of each first hole and a geometric center of the corresponding second hole directly adjacent to the first hole in the first direction are located on a straight line parallel to the first direction, and the geometric center of each first hole and a geometric center of the corresponding second hole directly adjacent to the first hole in the second direction are located on a straight line parallel to the second direction.

In some embodiments of the present disclosure, the first mask plate includes a non-perforated region between the first holes, the non-perforated region includes a straight portion extending along a straight line in the first direction, and a length of the straight portion in the first direction is substantially the same as a size of the first mask plate in the first direction.

In some embodiments of the present disclosure, the second mask plate includes an non-perforated region between the second holes, wherein the non-perforated region includes a straight portion extending along a straight line in the first direction, and a length of the straight portion in the first direction is substantially the same as a size of the second mask plate in the first direction.

In some embodiments of the present disclosure, the set of mask plates further comprises a third mask plate patterned to include an array of third holes, wherein the third holes are positioned in the third mask plate so that when the first mask plate, the second mask plate, and the third mask plate are stacked and aligned, the third holes are provided between the first holes and the second holes, and each of the third holes has a shape of a polygon with rounded corners.

According to fourth aspect of the present disclosure, there is provided a display panel, including a plurality of first light emitting layers configured to emit a light of a first color when excited; a plurality of second light emitting layers configured to emit a light of a second color when excited; and a plurality of third light emitting layers configured to emit a light of a third color when excited; wherein the first light emitting layers and the second light emitting layers are alternately arranged in a first direction and a second direction crossing the first direction, and the third light emitting layers are arranged between the first light emitting layers and the second light emitting layers, each of the first light emitting layers and the second light emitting layers includes two first corners opposite to each other in the first direction and two second corners opposite to each other in the second direction, the two second corners of each first light emitting layer are chamfered to provide first gap regions between the plurality of first light emitting layers, and each first gap region includes a first straight portion extending along a straight line in the first direction without overlapping the first light emitting layer, and a length of the first straight portion along the first direction is substantially equal to a size of the display panel in the first direction, and wherein the two second corners of each second light emitting layer are chamfered to provide second gap regions between the second light emitting layers, and each second gap region includes a second straight portion extending along a straight line in the first direction without overlapping the second light emitting layer, and a length of the second straight portion along the first direction is substantially equal to a size of the display panel in the first direction.

In some embodiments of the present disclosure, the two first corners of each first light emitting layer are chamfered to provide third gap regions between the first light emitting layers, and each third gap region includes a third straight portion extending along a straight line in the second direction without overlapping the first light emitting layer, and a length of the third straight portion along the second direction is substantially equal to a size of the display panel in the second direction, and the two first corners of each second light emitting layer are chamfered to provide fourth gap regions between the second light emitting layers, each fourth gap region includes a fourth straight portion extending along a straight line in the second direction without overlapping with the second light emitting layer, and a length of the fourth straight portion along the second direction is substantially equal to the size of the display panel in the second direction.

In some embodiments of the present disclosure, the display panel has a substantially rectangular outline, the outline including two first sides extending in the first direction and two second sides extending in the second direction.

These and other aspects of the present disclosure will be clearly understood from the embodiments described below, and will be described with reference to the embodiments below.

BRIEF DESCRIPTION OF THE DRAWINGS

In the following description of exemplary embodiments in conjunction with the accompanying drawings, more details, features and advantages of the present disclosure are disclosed. In the accompanying drawings.

DETAIL DESCRIPTION OF THE EMBODIMENTS

Figure 1:
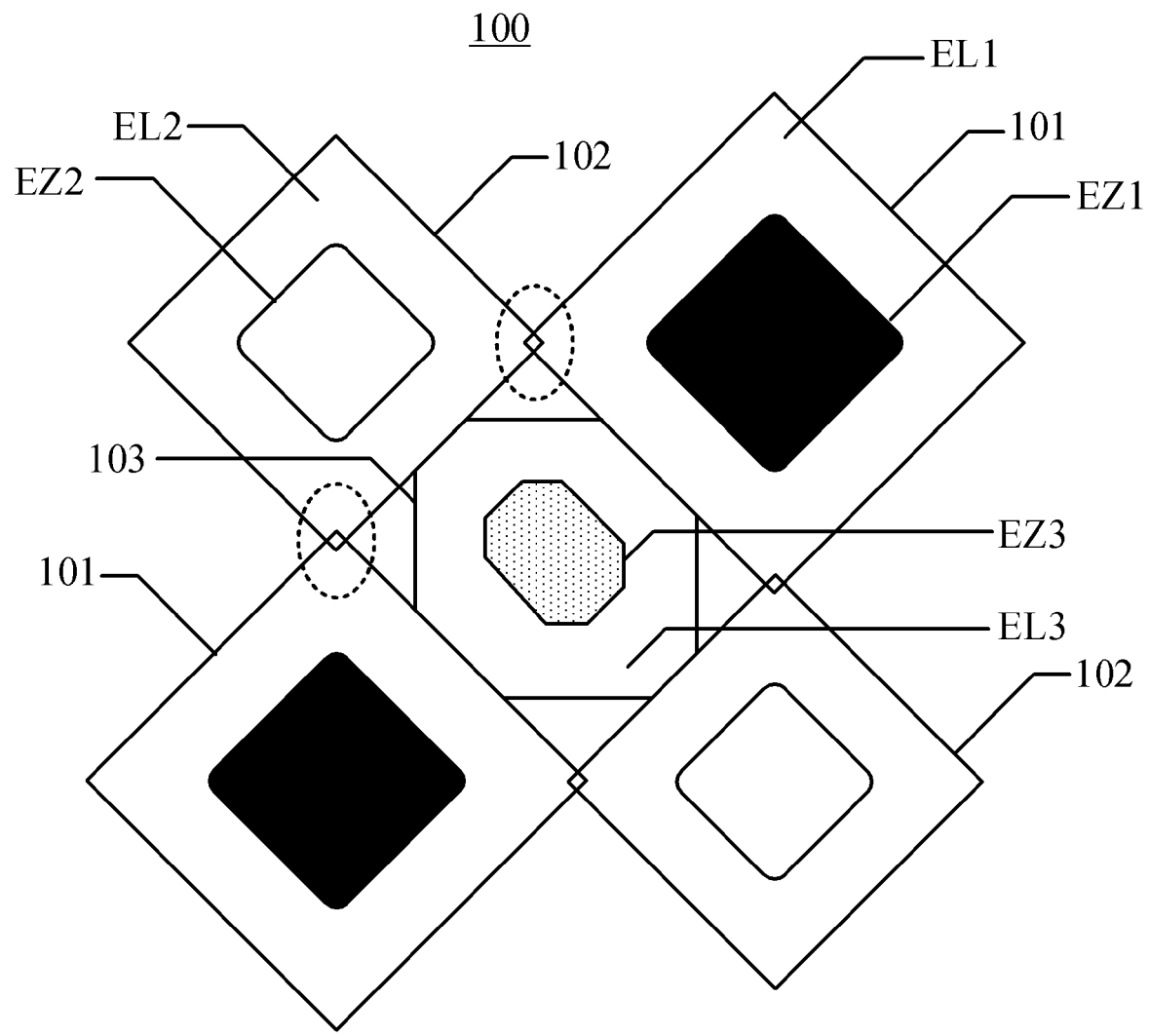
FIG. 1 schematically shows a plan view of the arrangement of sub-pixel regions in a typical OLED display panel.

It will be understood that although the terms first, second, third, etc. may be used herein to describe various elements, components, regions, layers and/or sections, these elements, components, regions, layers and/or sections should not be restricted by these terms. These terms are only used to distinguish one element, component, region, layer or section from another region, layer or section. Therefore, the first element, component, region, layer or section discussed below may be referred to as a second element, component, region, layer or section without departing from the teachings of the present disclosure.

Terms about relative spaces such as "row", "column", "below", "under", "relatively lower", "on", "above", "relatively higher", etc. may be used herein to describe the relationship between one element or feature and another element or feature(s) as illustrated in the drawings for ease of description. It will be understood that these terms about relative spaces are intended to cover different orientations of the device in use or operation in addition to the orientation depicted in the drawings. For example, if the device in the drawing is turned over, then elements described as "under other elements or features" or "below other elements or features" or "lower than other elements or features" will be oriented as "above other elements or features". Thus, the exemplary terms "below" and "under" can encompass both an orientation of above and below. Terms such as "before" or "ahead" and "after" or "followed by" can similarly be used, for example, to indicate the order in which light passes through the elements. The device can be oriented in other ways (rotated by 90 degrees or in other orientations) and the spatial relative descriptors used in the descriptions are interpreted accordingly. In addition, it will also be understood that when a layer is referred to as "between two layers," it can be the only layer between the two layers, or one or more intervening layers may also be present.

The terms used herein are only for the purpose of describing specific embodiments and are not intended to limit the present disclosure. As used herein, the singular forms "a," "an," and "the" are intended to also include the plural, unless the context clearly dictates otherwise. It will be further understood that the terms "including" and/or "comprising" when used in this specification designate the existence of the described features, steps, operations, elements and/or components, but do not exclude the existence of one or more other features, steps, operations, elements, components, and/or groups thereof or addition of one or more other features, steps, operations, elements, components, and/or groups thereof. As used herein, the term "and/or" includes any and all combinations of one or more of the associated listed items.

It will be understood that when an element or layer is referred to as being "on another element or layer," "connected to another element or layer," "coupled to another element or layer," or "adjacent to another element or layer", it may be directly on another element or layer, directly connected to another element or layer, directly coupled to another element or layer, or directly adjacent to another element or layer, or intervening elements or layers may be present. On the contrary, when an element is referred to as being "directly on another element or layer", "directly connected to another element or layer", "directly coupled to another element or layer", "directly adjacent to another element or layer", no intermediate elements or layers exist. However, "on" or "directly on" should not be interpreted as requiring a layer to completely cover the underlying layer in any case.

The embodiments of the present disclosure are described herein with reference to schematic illustrations (and intermediate structures) of ideal embodiments of the present disclosure. Because of this, a change to the illustrated shape should be expected, for example, as a result of manufacturing technology and/or tolerances. Therefore, the embodiments of the present disclosure should not be interpreted as being limited to the specific shape of the regions illustrated herein, but should include, for example, shape deviations due to manufacturing. Therefore, the regions illustrated in the drawings are schematic in nature, and their shapes are not intended to illustrate the actual shapes of the regions of the device and are not intended to limit the scope of the present disclosure.

Unless otherwise defined, all terms (including technical and scientific terms) used herein have the same meaning as commonly understood by those of ordinary skill in the art to which this disclosure belongs. It will be further understood that terms such as those defined in commonly used dictionaries should be interpreted as having meanings consistent with their meanings in the relevant field and/or the context of this specification, and will not be idealized or overly interpreted in a formal sense, unless explicitly defined as such in this article.

FIG. 1 schematically shows a plan view of an arrangement 100 of sub-pixel regions in a typical OLED display panel.

Referring to FIG. 1, two first sub-pixel regions 101, two second sub-pixel regions 102, and one third sub-pixel region 103 are shown. These sub-pixel regions 101, 102, and 103 are arranged in an array, and include respective light emitting layers EL1, EL2, and EL3, and respective light emitting zones EZ1, EZ2 and EZ3 located in their respective central regions defined by corresponding openings of the pixel defining layer (not shown). The contour lines of the light emitting zones EZ1, EZ2, and EZ3 can be considered to roughly coincide with the boundary of the opening of the pixel defining layer. When the first light emitting layer EL1, the second light emitting layer EL2, and the third light emitting layer EL3 are excited, the respective light emitting zones EZ1, EZ2, and EZ3 will emit light of different colors.

Since the first light emitting layer EL1 and the second light emitting layer EL2 have corners opposite to each other in the horizontal direction, the horizontally adjacent first light emitting layer EL1 and the second light emitting layer EL2 may partially overlap each other. Similarly, since the first light emitting layer EL1 and the second light emitting layer EL2 have corners opposite to each other in the vertical direction, the vertically adjacent first light emitting layer EL1 and the second light emitting layer EL2 will also partially overlap each other, as shown in the dotted ellipse in FIG. 1. This tends to lead to the problem of carrier crosstalk. For example, when the first light emitting layer EL1 needs to be lit and the second light emitting layer EL2 needs to be extinguished, the carriers in the first light emitting layer EL1 may drift to the second light emitting layer EL2, causing the second light emitting layer EL2 to slightly emit light, resulting in undesirable color mixing.

Figure 2A:
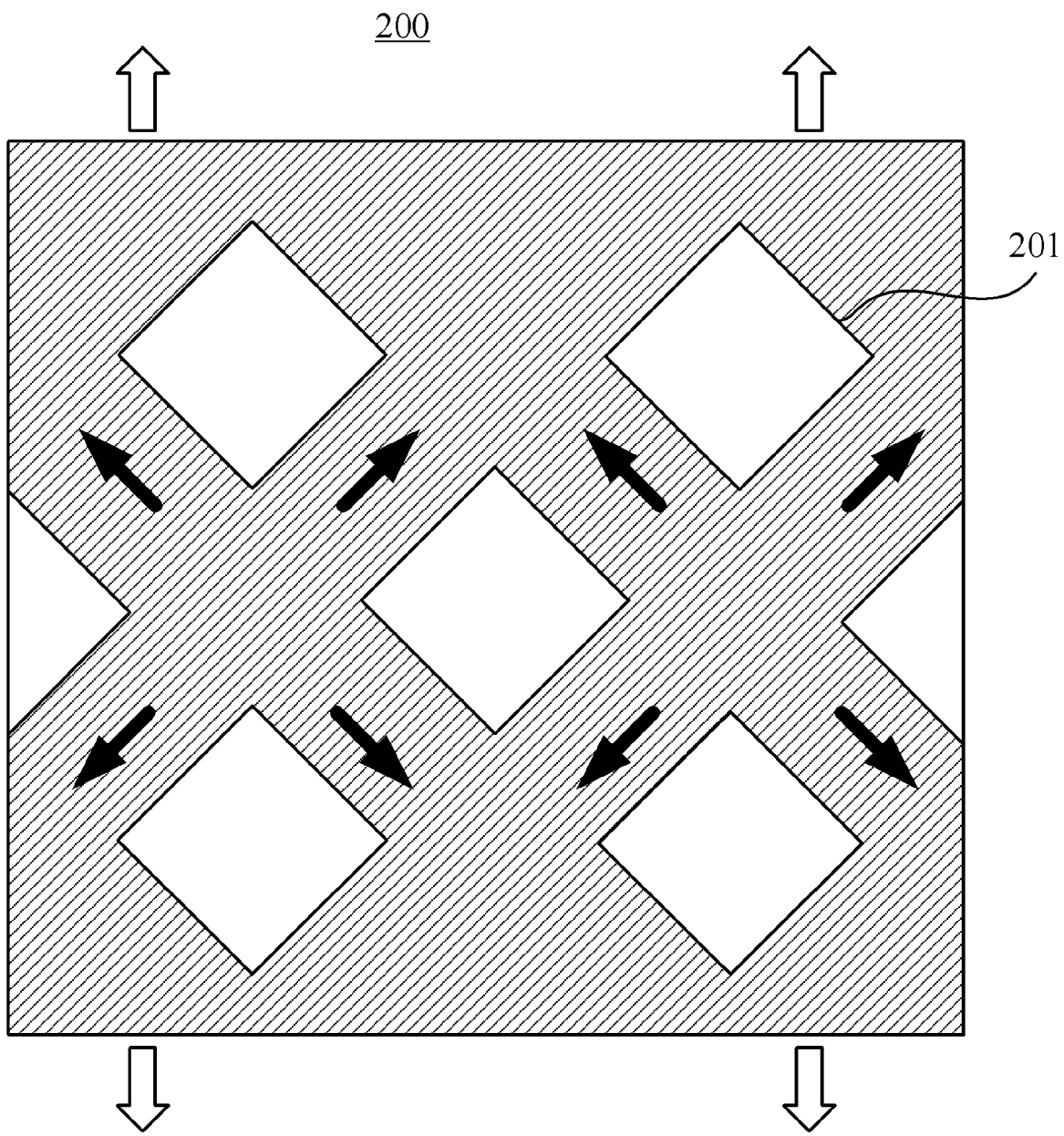
FIG. 2A schematically shows a plan view of a typical mask plate used to evaporate an organic light emitting material to form a pattern of a light emitting layer.

FIG. 2A schematically shows a plan view of a typical mask plate 200 used to evaporate an organic light emitting material to form a pattern of a light emitting layer. For the convenience of illustration, only a partial region of the mask plate 200 is shown.

Referring to FIG. 2A, the mask plate 200 is patterned into an array including holes 201, wherein the pattern of the holes 201 may, for example, correspond to the pattern of the first light emitting layer EL1 or the second light emitting layer EL2 in FIG. 1. That is, the mask plate 200 may be used to form the first light emitting layer EL1 or the second light emitting layer EL2 shown in FIG. 1.

In order to ensure the position accuracy and dimensional accuracy of the formed pattern, the mask plate needs to be tensioned in a predetermined direction with a certain stretching force during use to prevent the mask plate from being deformed by gravity or heat. The predetermined direction in which the stretching force is applied is related to the size of the mother substrate used during vapor deposition and the shape of the hole of the mask plate (or similarly, the shape of the light emitting layer to be formed). Generally, the stretching force is applied in a direction parallel to the short side of the mother substrate. For example, if the mother substrate has a size of 750 mm×650 mm, then the stretching force is applied in a direction parallel to the side of the mother substrate with the length of 650 mm. In some cases, the stretching force is applied along the direction of the corner of the hole of the mask plate.

Figure 2B:
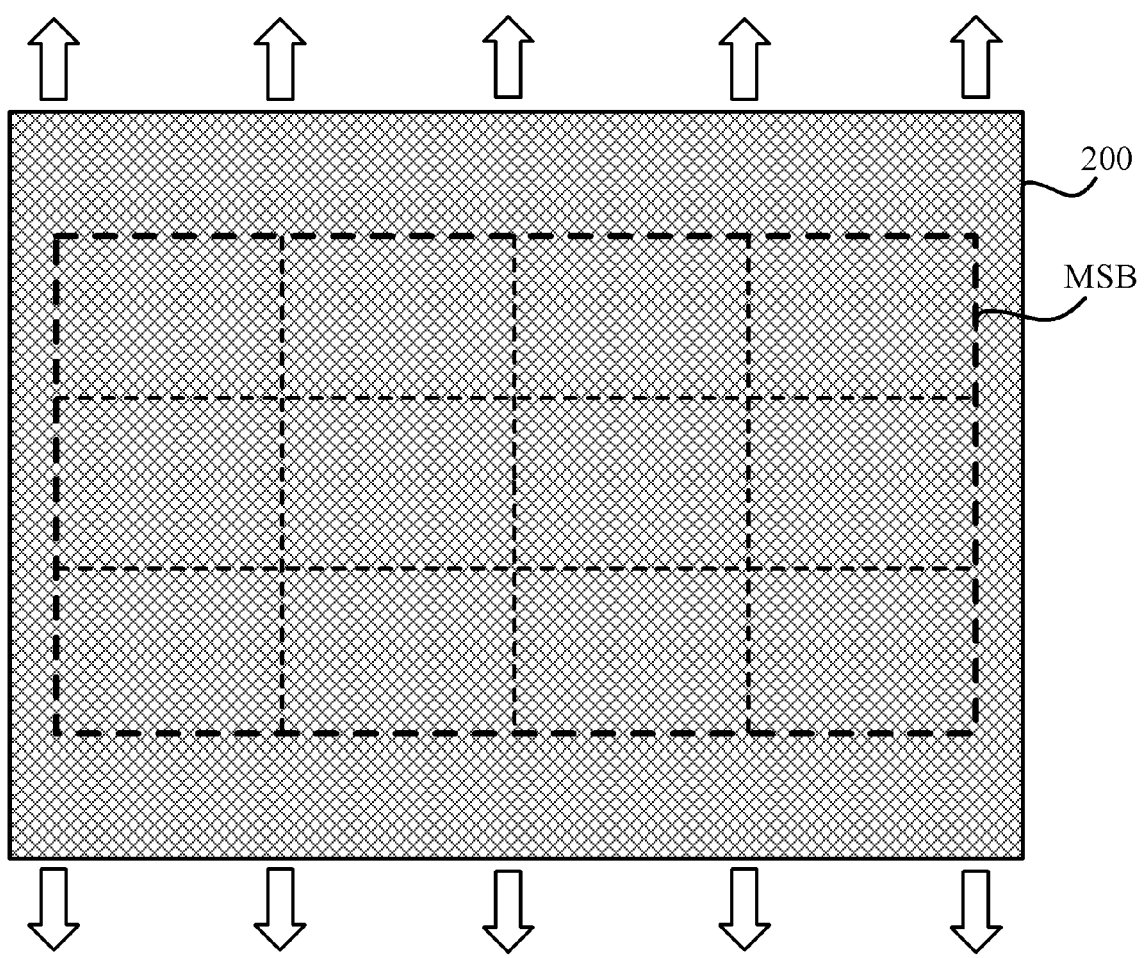
FIG. 2B schematically shows the arrangement relationship of the mask plate 200 relative to the mother substrate MSB during the evaporation process.

FIG. 2B schematically shows the arrangement relationship of the mask plate 200 with respect to the mother substrate MSB during the evaporation process.

Referring to FIG. 2B, the mask plate 200 is arranged above the mother substrate MSB (shown as a dashed rectangular frame), and the evaporated light emitting material is driven through the holes 201 in the mask plate 200 (not shown in FIG. 2B for the convenience of illustration) and deposited on the mother substrate MSB to form the corresponding pattern of the light emitting layer. In this process, the mask plate 200 is tensioned in a direction parallel to the short side of the mother substrate MSB, as indicated by the hollow arrow in FIG. 2B. In the subsequent process, the mother substrate MSB can be diced and cut into 3×4 display panels along the intersecting dotted line.

Referring back to FIG. 2A, in the case of the mask plate 200, the stretching force is applied in the direction indicated by the hollow arrow. The stretching force is conducted inside the mask plate 200, and due to the presence of the array of holes 201, the conductive path must bypass these holes, as indicated by the solid arrow in FIG. 2A. This causes the conductive path of the stretching force to deviate from the predetermined direction in which the stretching force is applied, which affects the stretching effect of the mask plate 200.

In addition, the four right angles of the through holes 201 have high requirements on the manufacturing process of the mask plate 200. The holes 201 of the mask plate 200 is usually formed by etching a metal sheet with an etching solution, and the etching load of the etching solution at the right angles is different than that at the straight sides. In the case of the same etching solution concentration, the etching load at the right angle is twice that at the straight edge. That is to say, in the case of the same etching solution concentration, if the accuracy of the straight edge is to be ensured, the etching accuracy of the right angle cannot be guaranteed, and if the accuracy of the right angle is to be ensured, the straight edge will be over-etched.

Figure 3A:
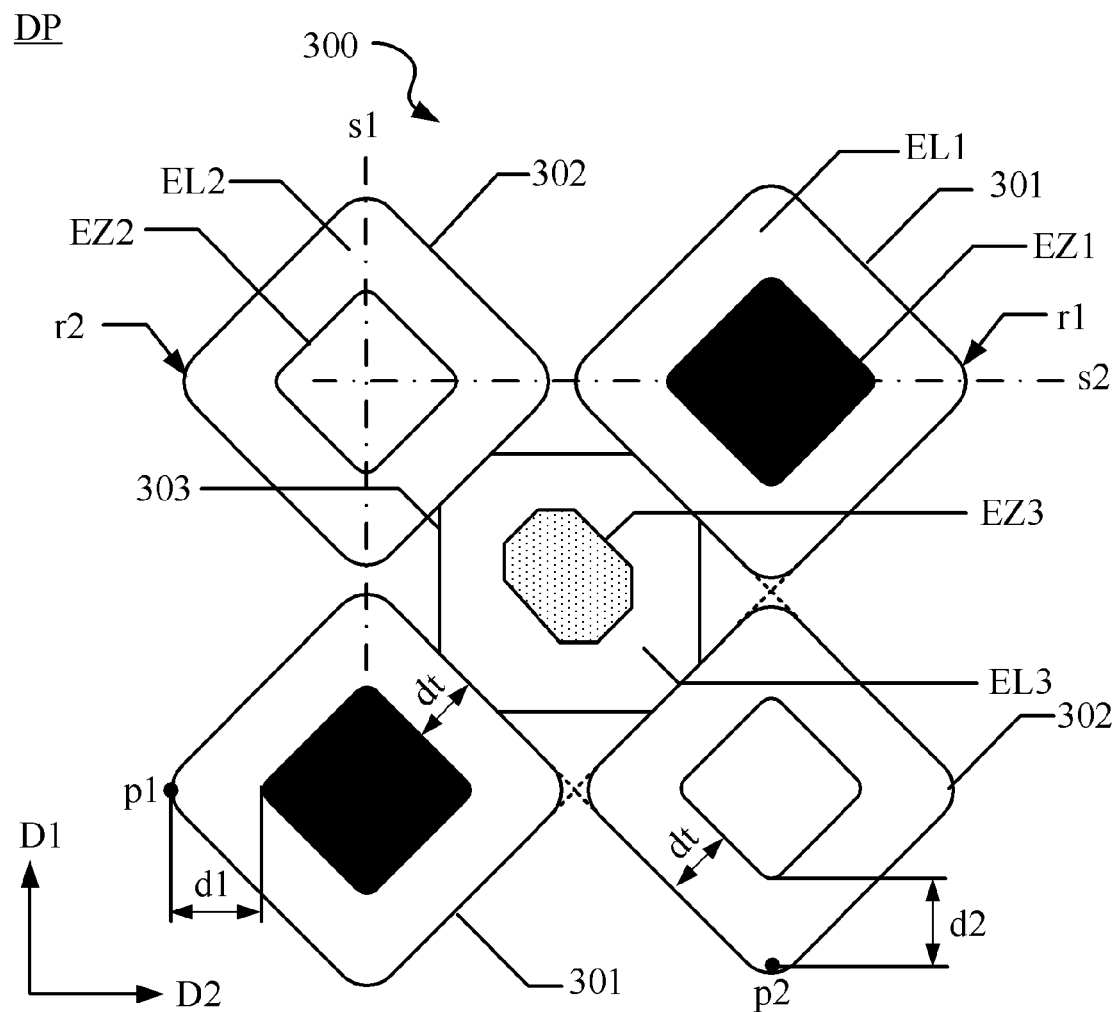
FIG. 3A schematically shows a plan view of the arrangement of five sub-pixel regions in a display panel according to an embodiment of the present disclosure.

FIG. 3A schematically shows a plan view of an arrangement 300 of five sub-pixel regions in a display panel DP according to an embodiment of the present disclosure.

Referring to FIG. 3A, a first sub-pixel region 301, a second sub-pixel region 302, and a third sub-pixel region 303 are shown. These sub-pixel regions 301, 302, and 303 include respective light emitting layers EL1, EL2, and EL3 and respective light emitting zones EZ1, EZ2, and EZ3.

The first light emitting layer EL1 and the second light emitting layer EL2 are alternately arranged in the first direction D1 and the second direction D2 crossing the first direction D1. In this example, the second direction D2 is substantially perpendicular to the first direction D1, although this is not required. The term "substantially" as used herein is intended to cover deviations from ideal conditions introduced due to, for example, a manufacturing process.

Each third light emitting layer EL3 is provided between respective first light emitting layer EL1 and respective second light emitting layer EL2. Specifically, as shown in FIG. 3A, each third light emitting layer EL3 is surrounded by two directly adjacent first light emitting layers EL1 (one in the upper right, one in the lower left) and two second light emitting layers EL2 (one in the upper left, one in the lower right). More specifically, the third light emitting layer EL3 is located inside a quadrilateral that are formed by connecting the geometric center of the upper left second light emitting layer EL2, the geometric center of the upper right first light emitting layer EL1, the geometric center of the lower right second light emitting layer EL1, and the geometric center of the lower left first light emitting layer EL1.

Each of the first light emitting layer EL1 and the second light emitting layer EL2 includes two first corners (specifically, an upper corner and a lower corner) opposed to each other in the first direction D1 and two second corners (specifically, one left corner and one right corner) opposite to each other in the second direction D2. Each of the first corner and the second corner is chamfered so that the first light emitting layer EL1 and the second light emitting layer EL2 do not overlap each other. The phrase "the first corner of the light emitting layer" as used herein refers to an area of the light emitting layer that is more protruding in the first direction D1 relative to other areas of the light emitting layer, and as used herein, the phrase "second corner of the light emitting layer" refers to an area of the light emitting layer that is more protruding in the second direction D2 relative to other areas of the light emitting layer. The phrase "A and B do not overlap each other" as used herein means that there is no intersection between the footprint of A and the footprint of B. In the field of machining, "chamfering" refers to the processing of cutting the corners of the work piece into a certain bevel. Chamfering includes flat chamfering and round chamfering. As used in the present disclosure, the meaning of the term "chamfering" is similar to the meaning of "chamfering" in the field of machining, and refers to cutting off sharp corners of an area with a certain shape. As will be described in detail later, the edges of the cut corners may be straight (that is, flat chamfered) or arc-shaped (that is, round chamfered).

A first corner of each first light emitting layer EL1 is directly adjacent to a first corner of a corresponding second light emitting layer EL2, and the corresponding second light emitting layer EL2 is directly adjacent to the first light emitting layer EL1 in the first direction D1, and the distance between the first corner of the first light emitting layer EL1 and the first corner of the corresponding second light emitting layer EL2 is the minimum distance between the first light emitting layer EL1 and the corresponding second light emitting layer EL2. The phrase "the distance between one corner and the other corner" as used herein means the smallest distance among the distances between each point on the corner and each point on the other corner. In the example of FIG. 3A, the lower corner of the upper right first light emitting layer EL1 is directly adjacent to the upper corner of the lower right second light emitting layer EL2, and the distance between the lower corner of the upper right first light emitting layer EL1 and the upper corner of the lower right light emitting layer EL2 is the minimum distance between the upper right first light emitting layer EL1 and the lower right second light emitting layer EL2. It will be understood that the phrase "A and B partially overlap" as used herein encompasses situations where A and B touch each other (i.e., A and B share a boundary).

The two sides forming the lower corner of the upper right first light emitting layer EL1 include respective straight portions, and respective imaginary extension lines of the straight portions intersect to form a first virtual corner, as shown by the dashed line in FIG. 3A. The two sides forming the upper corner of the lower right second light emitting layer EL2 include respective straight portions, and respective imaginary extension lines of the straight portions intersect to form a second virtual corner, as shown by the dashed line in FIG. 3A. The first virtual corner and the second virtual corner partially overlap. The same applies to the other first light emitting layers EL1 and the second light emitting layers EL2 in the display panel DP, and helps the first light emitting layer EL1 and the second light emitting layer EL2 have as large an area as possible.

A second corner of each first light emitting layer EL1 is directly adjacent to a second corner of the corresponding second light emitting layer EL2, and the corresponding second light emitting layer EL2 is directly adjacent to the first light emitting layer EL1 in the second direction D2, and the distance between the second corner of the first light emitting layer EL1 and the second corner of the corresponding second light emitting layer EL2 is the minimum distance between the first light emitting layer EL1 and the corresponding second light emitting layer EL2. In the example of FIG. 3A, the right corner of the lower left first light emitting layer EL1 is directly adjacent to the left corner of the lower right second light emitting layer EL2, and the distance between the right corner of the lower left first light emitting layer EL1 and the left corner of the lower right second light emitting layer EL2 is the minimum distance between the lower left first light emitting layer EL1 and the lower right second light emitting layer EL2.

The two sides forming the right corner of the lower left first light emitting layer EL1 include respective straight portions, and respective imaginary extension lines of the straight portions intersect to form a third virtual corner, as shown by the dashed line in FIG. 3A. The two sides forming the left corner of the lower right second light emitting layer EL2 include respective straight portions, and respective imaginary extension lines of the straight portions intersect to form a fourth virtual corner, as shown by the dashed line in FIG. 3A. The third virtual corner partially overlaps the fourth virtual corner. The same applies to other first light emitting layers EL1 and the second light emitting layers EL2 in the display panel DP, and helps the first light emitting layer EL1 and the second light emitting layer EL2 have as large an area as possible.

In the example of FIG. 3A, each of the first corner and the second corner of each first light emitting layer EL1 is rounded with a first radius r1 (that is, a rounded corner). The first radius is typically greater than or equal to 10 microns (um), and each of the first corner and the second corner of each second light emitting layer EL2 is rounded with a second radius r2, the second radius is typically greater than or equal to 10 um. In other embodiments, the corners may be rounded with a radius of other numerical values.

As a result of the chamfering, the first light emitting layer EL1 and the second light emitting layer EL2 that are directly adjacent in the first direction D1 are spatially separated from each other, and the first light emitting layer EL1 and the second light emitting layer EL2 that are directly adjacent in the second direction D2 are also spaced apart from each other. This avoids the problem of carrier crosstalk and therefore avoids undesirable color mixing. Moreover, the first light emitting layer EL1 and the second light emitting layer EL2 with rounded corners do not require their mask plates to have holes with sharp corners, which increases the contact area between the mask plate material and the etching solution. This helps to alleviate or eliminate poor etching accuracy at sharp corners caused by etching load.

In some embodiments, the minimum distance d1 from any point p1 on the edge of each of the first corner and the second corner of each first light emitting layer EL1 to the boundary of the corresponding first light emitting zone EZ1 is greater than or equal to an offset tolerance value dt, and the minimum distance d2 from any point p2 on the edge of each of the first and second corners of each second light emitting layer EL2 to the boundary of the corresponding second light emitting zone of EZ2 is greater than or equal to the offset tolerance value dt. The offset tolerance value dt is a design value that takes into account process errors, and is typically 9-12 um. In this example, when designing the pixel arrangement, the minimum distance between the straight edge of the light emitting layer and the straight edge of the light emitting zone is expected to be equal to the offset tolerance value dt.

In some embodiments, the geometric center of each first light emitting layer EL1 and the geometric center of the corresponding second light emitting layer EL2 directly adjacent to the first light emitting layer EL1 in the first direction D1 are located on a straight line s1 parallel to the first direction D1, and the geometric center of each first light emitting layer EL1 and the geometric center of the corresponding second light emitting layer EL2 directly adjacent to the first light emitting layer EL1 in the second direction D2 are located on a straight line s2 parallel to the second direction D2. Each third light emitting layer EL3 provided between each first light emitting layer EL1 and each second light emitting layer EL2 does not overlap the straight lines s1 and s2.

It will be understood that the shapes of the light emitting layer and the light emitting zone shown in FIG. 3A are exemplary, and other embodiments are possible. For example, each first light emitting layer EL1 may include additional corners protruding in a direction different from the first direction D1 and the second direction D2, and these additional corners may or may not be chamfered.

Figure 3B:
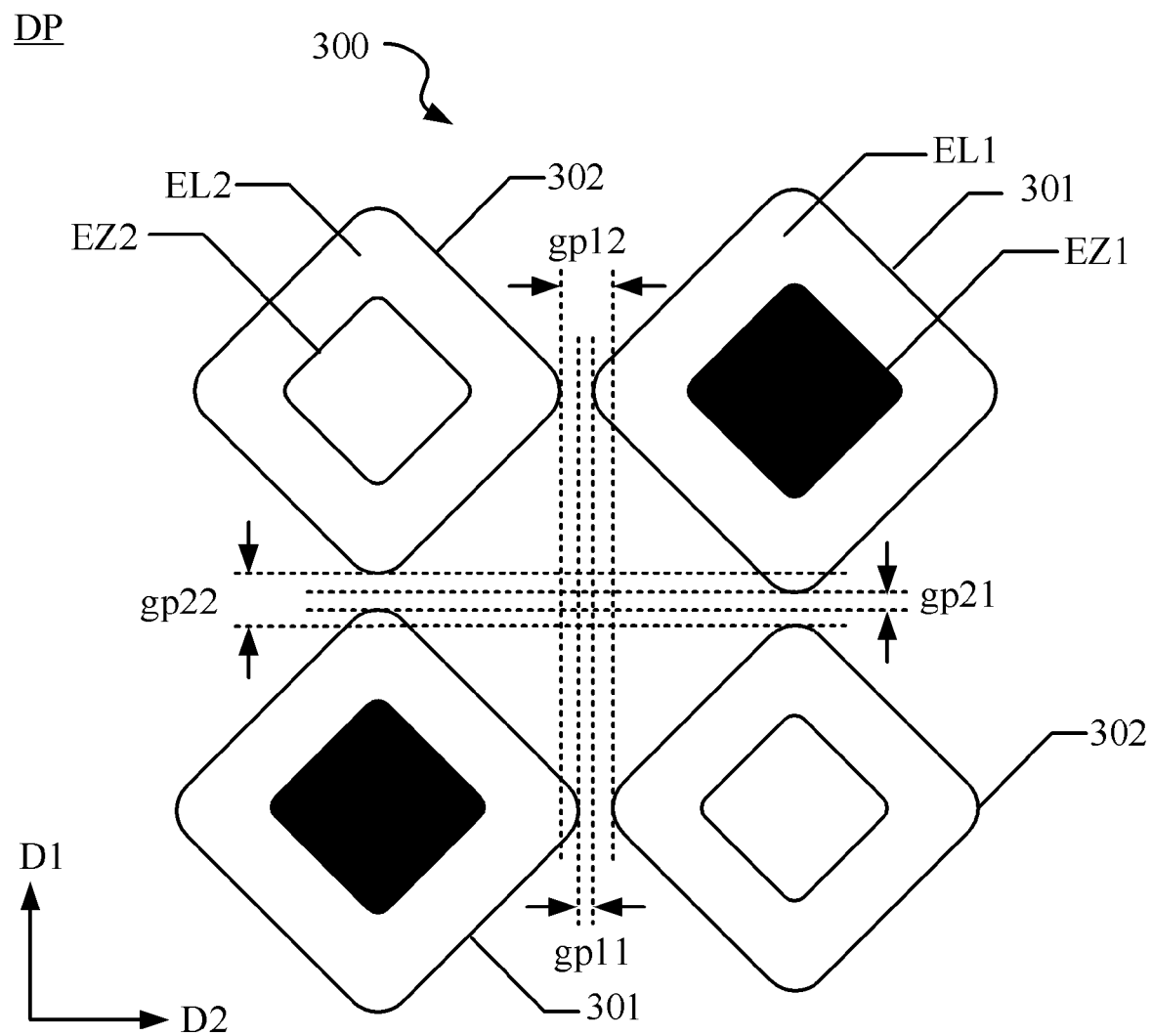
FIG. 3B schematically shows a plan view of the first sub-pixel region and the second sub-pixel region in the arrangement of the sub-pixel region of FIG. 3A.

More generally, the display panel DP according to an embodiment of the present disclosure can be described as follows with reference to FIG. 3B. FIG. 3B more clearly shows the first sub-pixel region 301 and the second sub-pixel region 302 in the arrangement 300 of the sub-pixel regions of FIG. 3A, where the sub-pixel region 303 is omitted for clarity of illustration.

Referring to FIG. 3B, two second corners of each first light emitting layer EL1 opposite to each other in the second direction D2 are chamfered to provide a gap region gp11 among the first light emitting layers EL1. Each gap region gp11 includes a first straight portion extending in a straight line in the first direction D1 without bending, and the length of the first straight portion along the first direction D1 is substantially the same as that of the display panel DP in the first direction D1. Also, two second corners of each second light emitting layer EL2 opposite to each other in the second direction D2 are chamfered to provide a gap region gp12 between each of the second light emitting layers EL2. Each gap region gp12 includes a second straight portion extending in a straight line in the first direction D1 without bending, and the length of the second straight portion along the first direction D1 is substantially the same as the dimension of the display panel DP in the first direction D1. The gap region gp11 does not overlap any first light emitting layer EL1, and the gap region gp12 does not overlap any second light emitting layer EL2. As will be explained in more detail later, this can be achieved by modifying the hole pattern of the mask plate used to form these light emitting layers.

Similarly, two first corners of each first light emitting layer EL1 opposite to each other in the first direction D1 are chamfered to provide a gap region gp21 among the respective first light emitting layers EL1. Each gap region gp21 includes a third straight portion extending in a straight line in the second direction D2 without bending, and the length of the third straight portion along the second direction D2 is substantially the same as the dimension of the display panel DP in the second direction D2. Also, two first corners of each second light emitting layer EL2 opposite to each other in the first direction D1 are chamfered to provide a gap region gp22 between each of the second light emitting layers EL2. Each gap region gp22 includes a fourth straight portion extending in a straight line in the second direction D2 without bending, and the length of the fourth straight portion along the second direction D2 is substantially the same as the dimension of the display panel DP in the second direction D2. The gap region gp21 does not overlap any first light emitting layer EL1, and the gap region gp22 does not overlap any second light emitting layer EL2.

Figure 4:
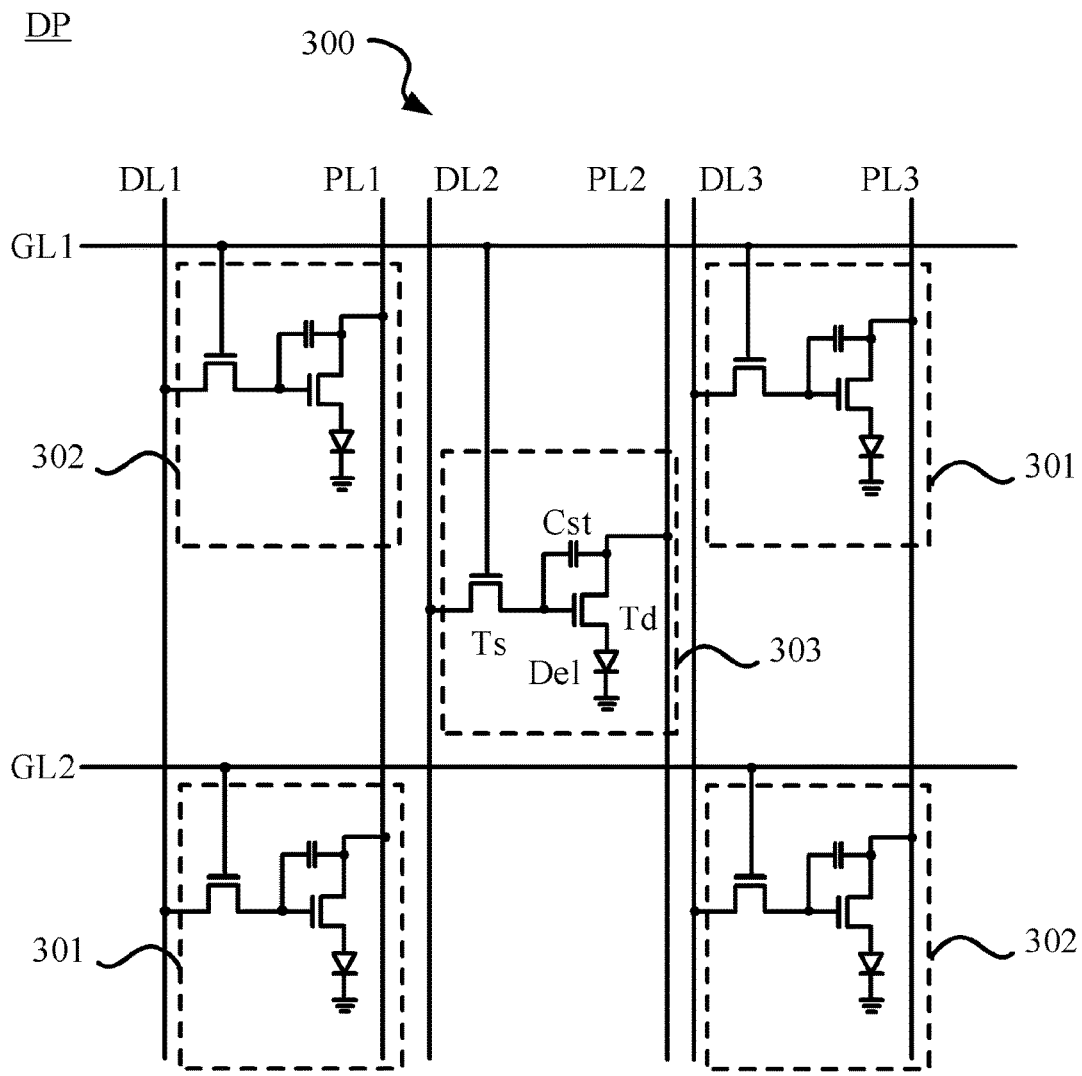
FIG. 4 schematically shows an example pixel circuit of the arrangement of the sub-pixel regions in the display panel of FIG. 3A.

FIG. 4 schematically shows an example pixel circuit of the arrangement 300 of the sub-pixel regions of the display panel DP of FIG. 3A.

Referring to FIG. 4, the display panel DP includes a first gate line GL1 and a second gate line GL2, a first data line DL1, a second data line DL2, a third data line DL3, a first power line PL1, a second power line PL2, and a third power line PL3. The first sub-pixel region 301 is formed at the intersection of the first gate line GL1 and the third data line DL3, the second sub-pixel region 302 is formed at the intersection of the first gate line GL1 and the first data line DL1, and the third sub-pixel region 303 is formed at the intersection of the first gate line GL1 and the second data line DL2. In addition, another first sub-pixel region 301 is formed at the intersection of the second gate line GL2 and the first data line DL1, and another second sub-pixel region 302 is formed at the intersection of the second gate line GL2 and the third data line DL3.

Each of the sub-pixel regions 301, 302, and 303 includes a switching transistor Ts, a driving transistor Td, a storage capacitor Cst, and a light emitting diode Del. This is a typical pixel circuit with two transistors and one capacitor ("2T1C"). It will be understood that the pixel circuit shown in FIG. 4 is only exemplary and schematic. In other embodiments, other forms of pixel circuits may be provided. For example, the gate of the switching transistor Ts in the third sub-pixel region 303 may be connected to the first gate line GL1 and in addition to the second gate line GL2. Alternatively, the gate of the switching transistor Ts in the third sub-pixel region 303 may be connected to a separate gate line different from the first gate line GL1 and the second gate line GL2. Any other suitable pixel circuit can also be used.

Figure 5:
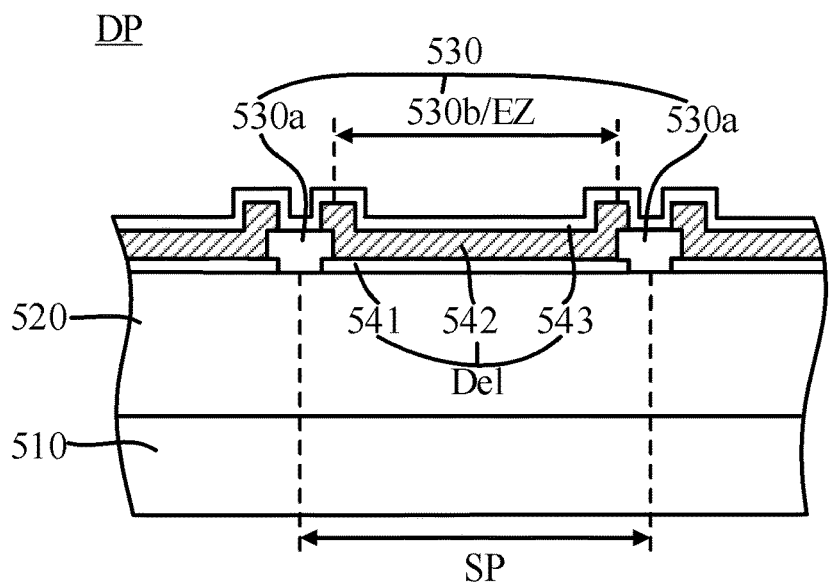
FIG. 5 schematically shows a cross-sectional view of the display panel of FIG. 3A.

FIG. 5 schematically shows a cross-sectional view of the display panel DP of FIG. 3A. For the convenience of description, it is assumed that the pixel circuit shown in FIG. 4 is used in the display panel DP.

Referring to FIG. 5, the display panel DP includes a base substrate 510 on which a driving transistor Td, a switching transistor Ts, and a storage capacitor Cst (not shown) are formed in each sub-pixel region. Although not shown, each of the driving transistor Td and the switching transistor Ts includes a gate electrode, a semiconductor layer, a source electrode, and a drain electrode. For example, the top gate type driving transistor Td includes a semiconductor layer of polysilicon, a gate insulating layer on the semiconductor layer, a gate electrode on the gate insulating layer, and source and drain electrodes above the gate electrode. The center of the semiconductor layer serves as a channel, and impurities are doped to both ends of the semiconductor layer. The source and drain electrodes contact the ends of the semiconductor layer.

The passivation layer 520 is formed on the entire surface of the base substrate 510 to cover the driving transistor Td, the switching transistor Ts, and the storage capacitor Cst (not shown). The passivation layer 520 may be formed of an inorganic insulating material (for example, silicon oxide or silicon nitride) or an organic insulating material (for example, benzocyclobutene or acrylic resin).

The first electrode 541 is formed on the passivation layer 520. The first electrode 541 serves as the anode of the light emitting diode Del, and is connected to the drain electrode of the driving transistor Td (not shown). It will be understood that although only one first electrode 541 is marked in FIG. 4, there are multiple first electrodes formed on the passivation layer 520. These first electrodes belong to respective sub-pixel regions SP, and can be formed by patterning a conductive layer (for example, made of indium tin oxide (ITO)). The sub-pixel region SP marked in FIG. 5 may be any one of the first sub-pixel region 301, the second sub-pixel region 302, and the third sub-pixel region 303 in FIG. 3A.

The pixel defining layer 530 is formed at the boundary of the first electrode 541 so as to delimit different sub-pixel regions SP. The pixel defining layer 530 includes a patterned bank 530a and a plurality of openings 530b separated by the bank. The position, size, and shape of the openings 530b determine the size and shape of the exposed portion of the first electrode 541, and thus define the position, size, and shape of the light emitting zone EZ of the sub-pixel region SP. It will be understood that although only one opening 530b is marked in FIG. 4, there are a plurality of openings formed in the corresponding sub-pixel region of the sub-pixel regions to expose the corresponding first electrode. The pixel defining layer 530 may be formed of an inorganic insulating material (for example, silicon oxide or silicon nitride) or an organic insulating material (for example, benzocyclobutene or acrylic resin).

The light emitting layer 542 is formed on the exposed portion of the first electrode 541 and covers the opening 530b. The area of the light emitting layer 542 is generally larger than the area of the opening 530b, so that the orthographic projection of the opening 530b on the base substrate 510 typically falls within the orthographic projection of the light emitting layer 542 on the base substrate 510. Alternatively, in some embodiments, the light emitting layer 542 may only fill the opening 530b without exceeding the opening 530b. The light emitting layer 542 may include an electron injection layer (EIL), an emission material layer (EML), and a hole injection layer (HIL) to improve emission efficiency. It will be understood that although only one light emitting layer 542 is marked in FIG. 5, there are multiple light emitting layers formed on the corresponding first electrode of the first electrodes, as shown by each shaded region in FIG. 5. The light emitting layer 542 marked in FIG. 5 may be any one of the first light emitting layer EL1, the second light emitting layer EL2, and the third light emitting layer EL3 in FIG. 3A.

The second electrode 543 is integrally formed on each light emitting layer 542. The second electrode 543 serves as a cathode of the light emitting diode Del, and may be formed of a conductive layer (for example, made of aluminum).

The first electrode 541, the light emitting layer 542, and the second electrode 543 form the light emitting diode Del. When the light emitting diode Del is excited, a region of the light emitting layer 542 that overlaps the opening 530b can effectively emit light, and may be defined as the light emitting zone EZ. As shown in FIG. 5, the contour of the light emitting zone EZ is determined by the shape of the opening 530b.

Figure 6:
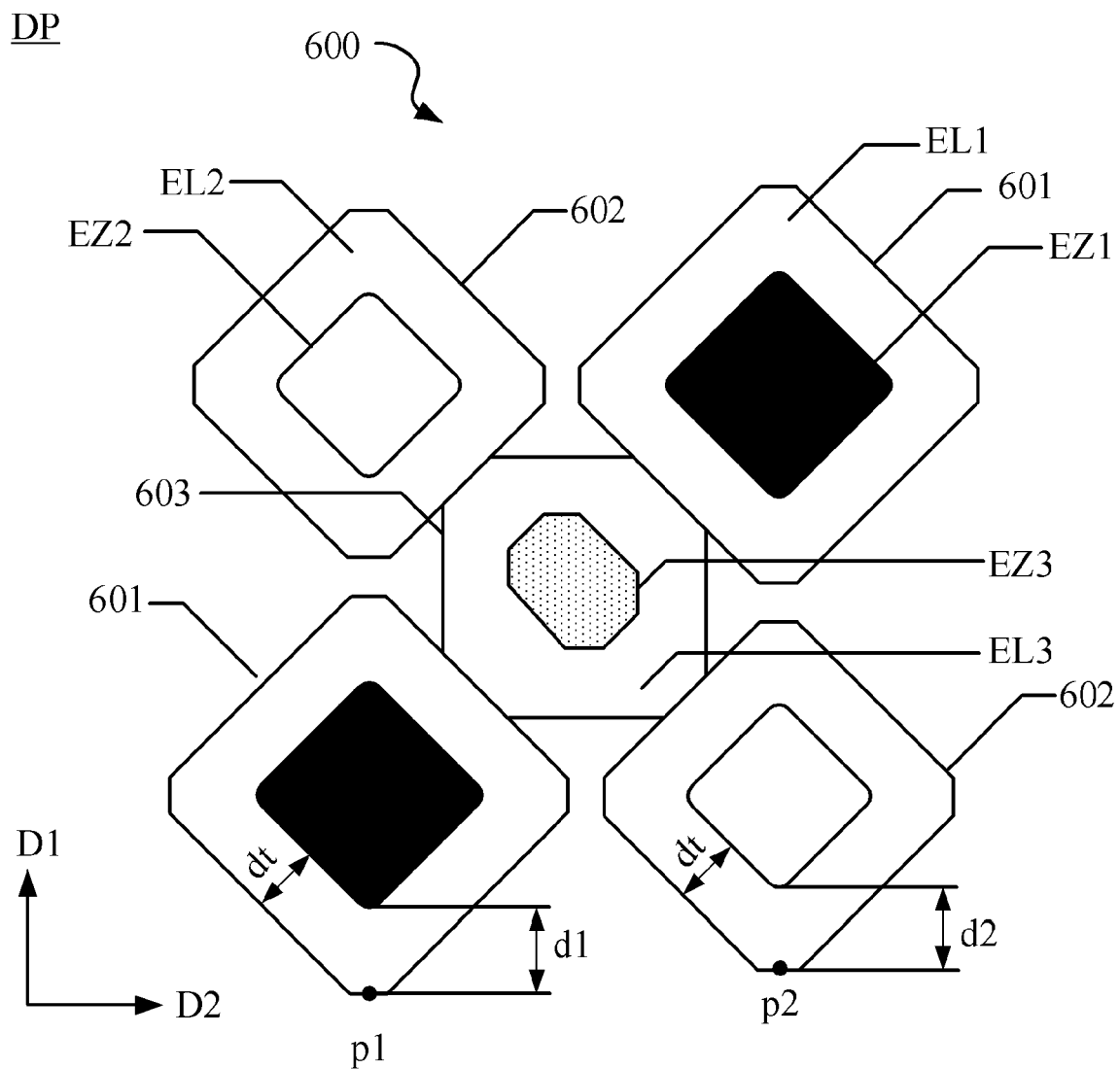
FIG. 6 schematically shows a plan view of a modification of the arrangement of sub-pixel regions in the display panel of FIG. 3A.

FIG. 6 schematically shows a plan view of a modification 600 of the arrangement of the sub-pixel regions in the display panel DP of FIG. 3A.

Referring to FIG. 6, the first sub-pixel region 601, the second sub-pixel region 602, and the third sub-pixel region 603 include respective light emitting layers EL1, EL2, and EL3, and the first light emitting layer EL1 and the second light emitting layer EL2 have shapes different from the shapes of those shown in FIG. 3A.

Specifically, each of the first corner and the second corner of each first light emitting layer EL1 is chamfered (that is, it becomes a flat chamfer), and each of the first corner and the second corner of each second light emitting layer EL2 is also chamfered. As a result, the first light emitting layer EL1 and the second light emitting layer EL2 directly adjacent in the first direction D1 are spatially separated from each other, and the first light emitting layer EL1 and the second light emitting layer EL2 directly adjacent in the second direction D1 are also spatially separated from each other. This avoids the problem of carrier crosstalk and therefore avoids undesirable color mixing.

The arrangement 600 of the sub-pixel regions may adopt the same configuration as the arrangement 300 of FIG. 3A in other respects. For example, the minimum distance d1 from any point p1 on the edge of each of the first and second corners of each first light emitting layer EL1 to the boundary of the corresponding first light emitting zone EZ1 is greater than or equal to a misalignment tolerance value dt, and the minimum distance d2 from any point p2 on the edge of each of the first and second corners of each second light emitting layer EL2 to the boundary of the corresponding second light emitting zone EZ2 is greater than or equal to the misalignment tolerance value dt.

It will be understood that although each of the first light emitting layer EL1 and the second light emitting layer EL2 that are chamfered is shown as having flat edges in FIG. 6, in practice, these flat edges may be rounded due to process reasons at their borders. That is, each flat edge may be rounded at its two ends. This still falls within the scope of this application.

Figure 7:
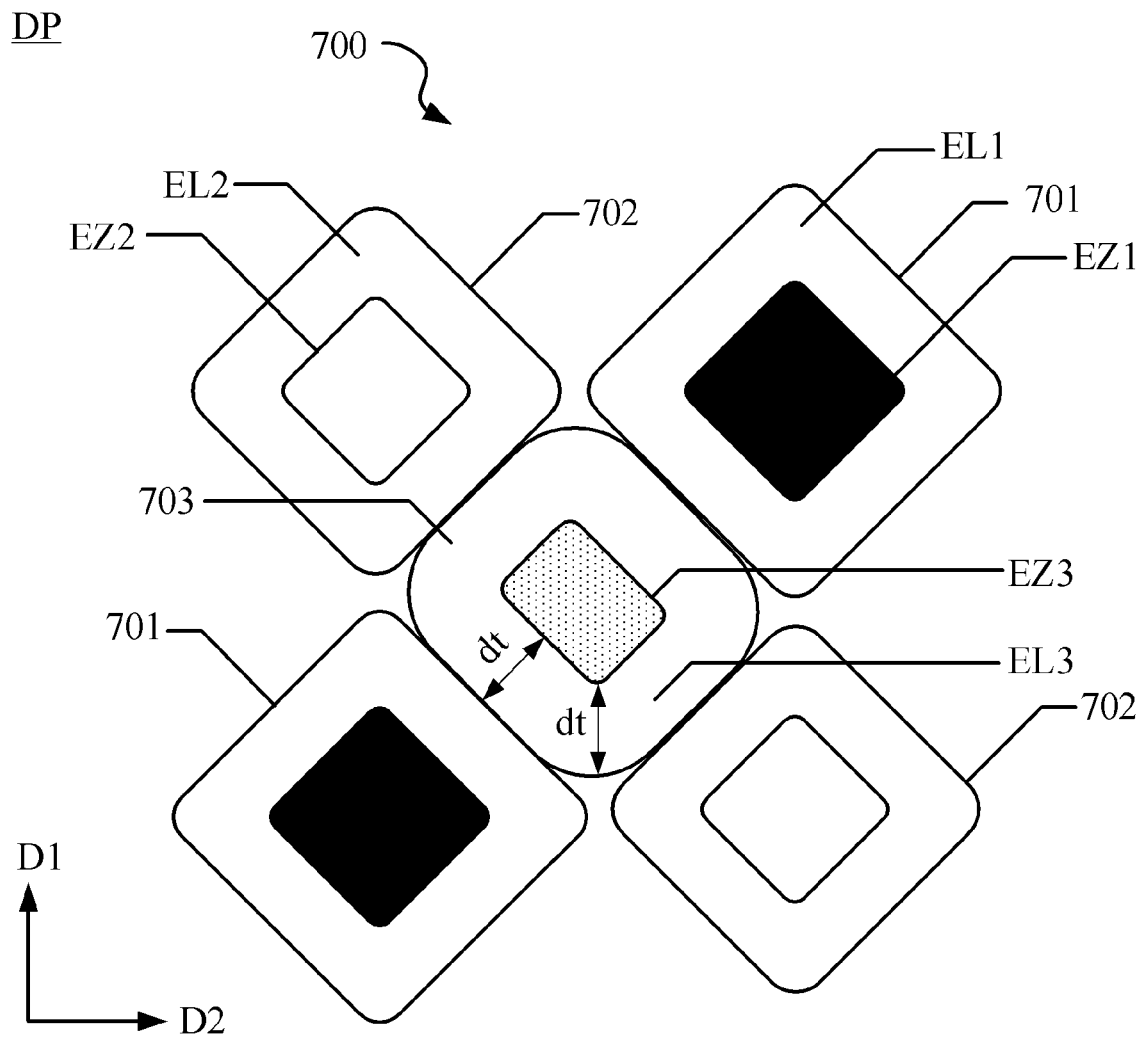
FIG. 7 schematically shows a plan view of another modification of the arrangement of sub-pixel regions in the display panel of FIG. 3A.

FIG. 7 schematically shows a plan view of another modification 700 of the arrangement of the sub-pixel regions in the display panel DP of FIG. 3A.

Referring to FIG. 7, the first sub-pixel region 701 and the second sub-pixel region 702 include respective light emitting layers EL1 and EL2 which have similar configuration as those shown in FIG. 3A. The arrangement 700 of the sub-pixel regions is different from the arrangement 300 in that the third light emitting layer EL3 in the third sub-pixel region 703 now has the shape of a polygon with rounded corners (in this example, a rectangle with rounded corners). Compared with the third light emitting layer EL3 of octagonal shape in FIG. 3A, the third light emitting layer EL3 of this polygon with rounded corners does not require the mask plate to have a hole with sharp corners, which helps to relieve or eliminate the poor accuracy at sharp corners caused by the etching load. It will be understood that the third light emitting layer EL3 shown in FIG. 7 is exemplary, and in other embodiments, the third light emitting layer EL3 may have a shape of other polygonal with rounded corners.

In some embodiments, each third light emitting zone EZ3 has a shape conformal to the shape of the corresponding third light emitting layer EL3, so that the distance from any point on the edge of the corresponding third light emitting layer EL3 to the third light emitting zone EZ3 is substantially equal to the misalignment tolerance value dt. In the example of FIG. 7, the third light emitting zone EZ3 has a shape of a rectangular with rounded corners that is similar as the shape of the corresponding third light emitting layer EL3, and is chamfered to have rounded corners with an appropriate chamfering radius smaller than the chamfering radius of the third light emitting layer EL3. More specifically, the minimum distance from any point on the edge of the third light emitting layer EL3 to the boundary of the third light emitting zone EZ3 is substantially equal to the misalignment tolerance value dt. This allows the third sub-pixel region to have a uniform misalignment tolerance value in all directions. That is, the process margin is the same in all directions, which facilitates process control.

Figure 8A:
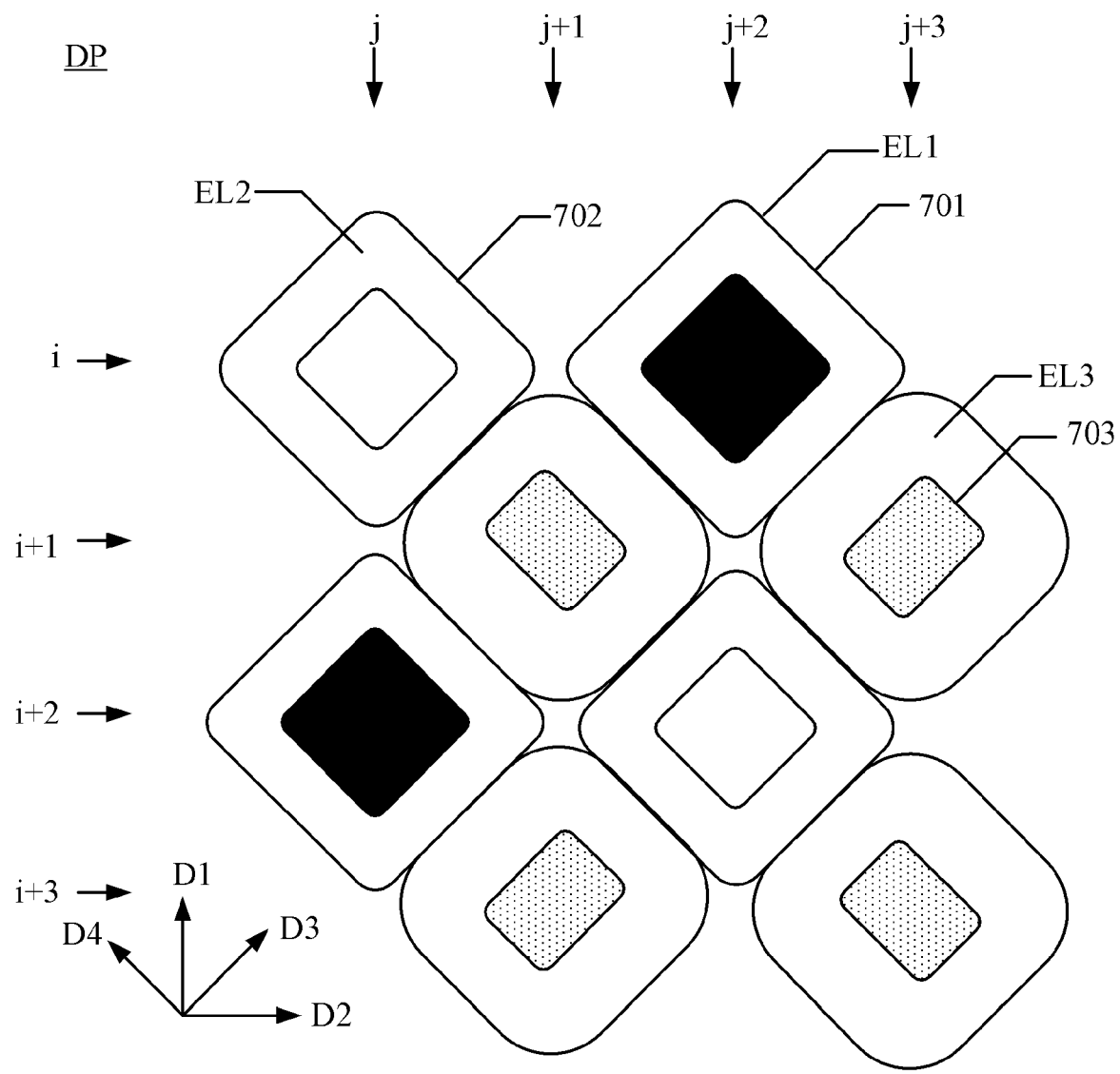
FIG. 8A schematically shows a plan view of multiple sub-pixel regions of a display panel according to an embodiment of the present disclosure.

FIG. 8A schematically shows a plan view of a plurality of sub-pixel regions of a display panel DP according to an embodiment of the present disclosure.

Referring to FIG. 8A, the first sub-pixel region 701, the second sub-pixel region 702, and the third sub-pixel region 703 have the same configuration as those described above with respect to FIG. 7. Specifically, the upper corner, lower corner, left corner, and right corner of each first light emitting layer EL1 are rounded with a first radius, and the upper corner, lower corner, left corner and right corner of each second light emitting layer EL2 are rounded with a second radius, and each third light emitting layer EL3 has a shape of a polygon with rounded corners (specifically, a rectangle with rounded corners).

In this example, the first direction D1 is substantially perpendicular to the second direction D2. Each first light emitting layer EL1 has a shape obtained by chamfering each of the four corners of a first square, the first diagonal and the second diagonal of the first square are respectively parallel to the first direction D1 and the second direction D2. Each second light emitting layer EL2 has a shape obtained by chamfering each of the four corners of a second square, the first diagonal and the second diagonal of the second square are respectively parallel to the first direction D1 and the second direction D2. Each third light emitting layer EL3 has a shape obtained by chamfering each of the four corners of a rectangle, and a long side of the rectangle faces a side of a corresponding first light emitting layer EL1 directly adjacent to the third light emitting layer EL3, and is substantially parallel to the side of the corresponding first light emitting layer EL1, and a short side of the rectangle faces a side of a corresponding second light emitting layer EL2 directly adjacent to the third light emitting layer EL3, and is substantially parallel to the side of the corresponding second light emitting layer EL2.

The two first sub-pixel regions 701, the two second sub-pixel regions 702, and the four third sub-pixel regions 703 shown in FIG. 8A form a repeating unit. The two first sub-pixel regions are arranged in the ith row and (j+2)th column, and the (i+2)th row and jth column, respectively. The two second sub-pixel regions are arranged in the ith row and jth column, and the (i+2)th row and (j+2)th column, respectively. The four third sub-pixel regions are respectively arranged in the (i+1)th row and the (j+1)th column, the (i+1)th row and the (j+3)th column, the (i+3)th row and the (j+1)th column, and the (i+3)th row and (j+3)th column (i and j are integers greater than zero). Here, the terms "row" and "column" are used with reference to the first direction D1 and the second direction D2 in FIG. 8A, that is, the direction parallel to the first direction D1 is called the row direction and the direction parallel to the second direction D2 is called the column direction.

A plurality of such repeating units are repeatedly arranged across the entire display panel DP in the first direction D1 and the second direction D2. This pixel arrangement is known as a Diamond pixel arrangement, where the first sub-pixel regions 701 are blue sub-pixels, the second sub-pixel regions 702 are red sub-pixels, and the third sub-pixel regions 703 are green sub-pixels.

The area of the light emitting zone of the red, green and blue sub-pixels is determined by the characteristics of the light emitting material. The blue light emitting material has a short service life, so the blue light emitting zone is usually made to have a larger area in order to delay aging.

Compared with blue and red, the human eyes are more sensitive to green, and therefore the green light emitting zone is usually made to have a smaller area. In some embodiments, the area ratio of the light emitting zones of the red, green, and blue sub-pixels is set as Sr:Sg:Sb=1:(1.2~1.5):(1.4~1.8), where Sr is the area of the red light emitting zone, Sg is the area of the green light emitting zone, and Sb is the area of the blue light emitting zone.

It will be understood that although not shown in FIG. 8A, the first light emitting layer EL1 and the second light emitting layer EL2 may adopt the same configuration as those described in FIG. 6. Alternatively or additionally, in some embodiments, the third light emitting layer EL3 may adopt the same configuration as those described in FIG. 3A or FIG. 6. In some embodiments, the third light emitting layer EL3 may also be chamfered to have a substantially elliptical shape without straight edges, and such a shape is still considered to be achieved by rounding each of the four corners of the rectangle.

More generally, the display panel DP according to an embodiment of the present disclosure may be described as including a plurality of first group light emitting layers arranged in a third direction D3 and a plurality of second group light emitting layers arranged in the third direction D3. Each of the plurality of first groups includes a plurality of first light emitting layers EL1 and a plurality of third light emitting layers EL3 arranged alternately, and each of the plurality of second groups includes a plurality of third light emitting layers EL3 and a plurality of second light emitting layers EL2 arranged alternately. The plurality of first groups and the plurality of second groups are alternately arranged in a fourth direction D4 crossing (for example, substantially perpendicular to) the third direction D3. The plurality of first groups and the plurality of second groups are arranged so as to form a plurality of third groups of light emitting layers arranged in the fourth direction D4 and a plurality of fourth groups arranged in the fourth direction D4. The plurality of third groups and the plurality of fourth groups are alternately arranged in the third direction D3. Each of the plurality of third groups includes a plurality of first light emitting layers EL1 and a plurality of third light emitting layers EL3 arranged alternately, and each of the plurality of fourth groups includes a plurality of third light emitting layers EL3 and a plurality of second light emitting layers EL2 that are alternately arranged.

Figure 8B:
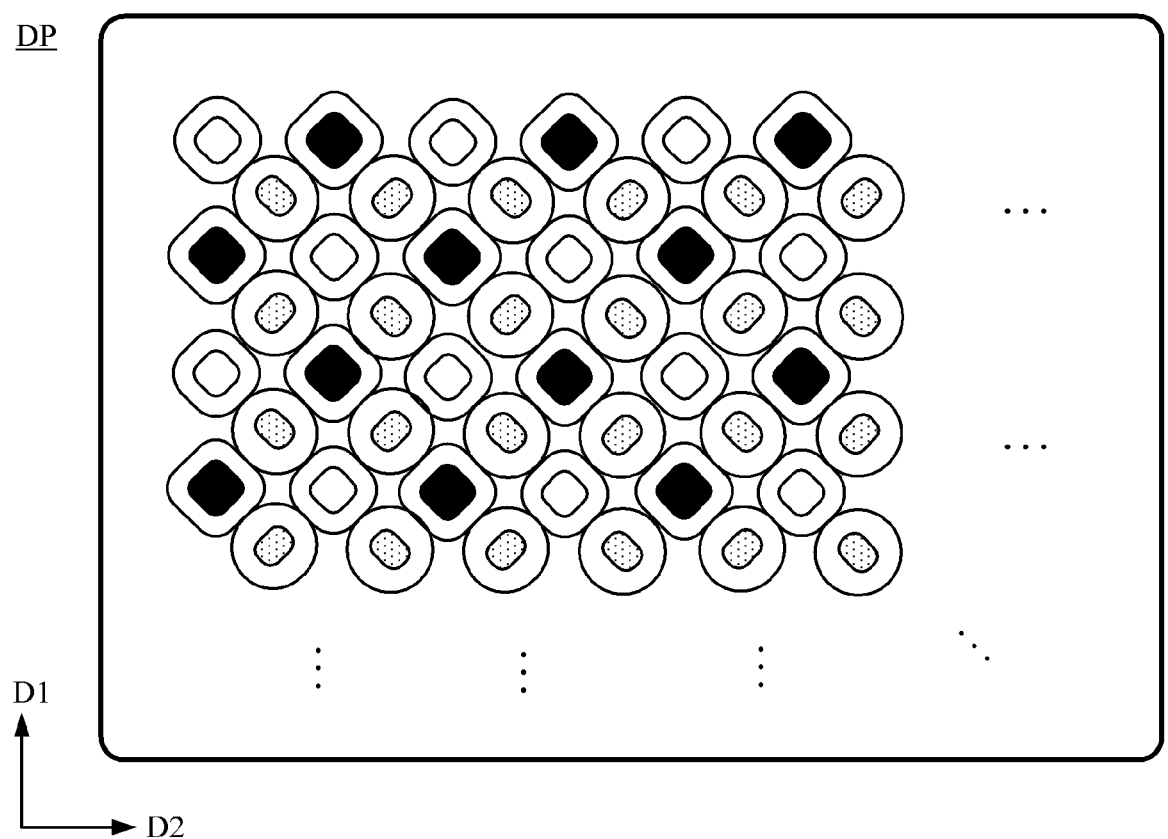
FIG. 8B schematically shows the outline of the display panel of FIG. 8A.

FIG. 8B schematically shows the outline of the display panel DP of FIG. 8A.

Referring to FIG. 8B, the display panel DP has a substantially rectangular outline which includes two first sides extending in a first direction D1 and two second sides extending in a second direction D2. A plurality of repeating units as shown in FIG. 8A are repeatedly arranged across the entire display panel DP in the first direction D1 and the second direction D2 to form an array of sub-pixels.

It will be understood that, in other embodiments, the display panel DP may have an outline that is rotated 90 degrees clockwise or counterclockwise with respect to that shown in FIG. 8B. That is, the rectangular outline of the display panel DP may have a longer side extending in the first direction D1 and a shorter side extending in the second direction D2.

Figure 9:
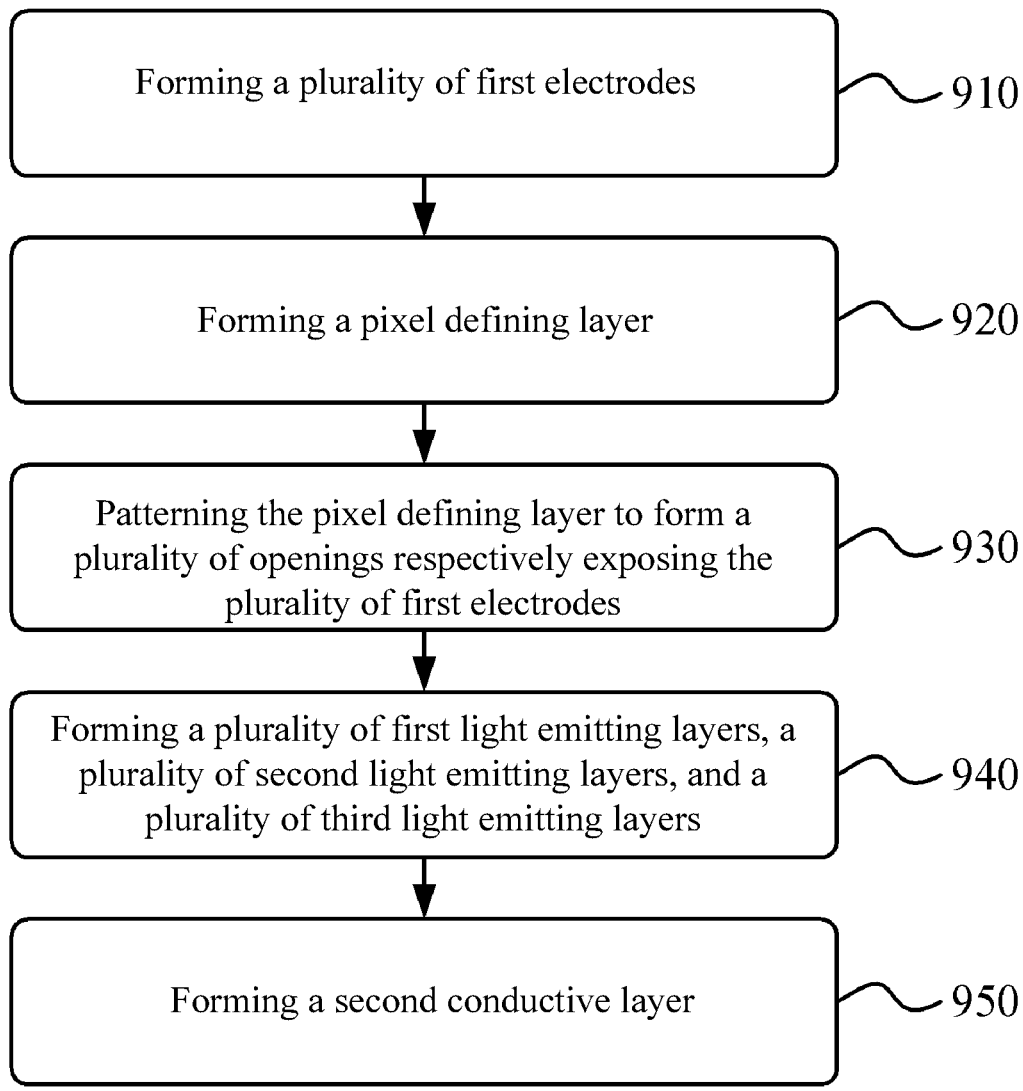
FIG. 9 schematically shows a flowchart of a method of manufacturing a display panel according to an embodiment of the present disclosure.

FIG. 9 schematically shows a flowchart of a method 900 for manufacturing a display panel according to an embodiment of the present disclosure, and FIGS. 10A to 10F schematically show cross-sectional views of the display panel DP obtained in each step of the method 900.

Figure 10A:
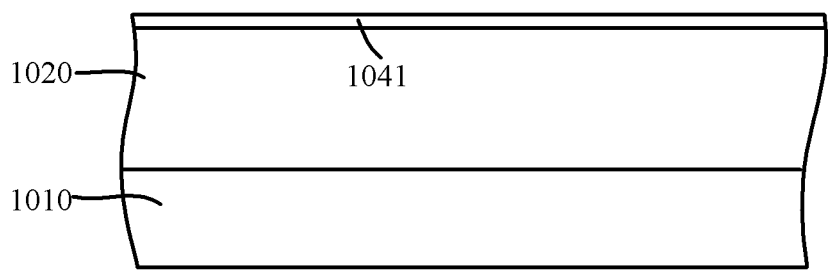
FIG. 10A to FIG. 10F schematically show cross-sectional views of the display panel obtained in the steps of the method of FIG. 9.
Figure 10B:
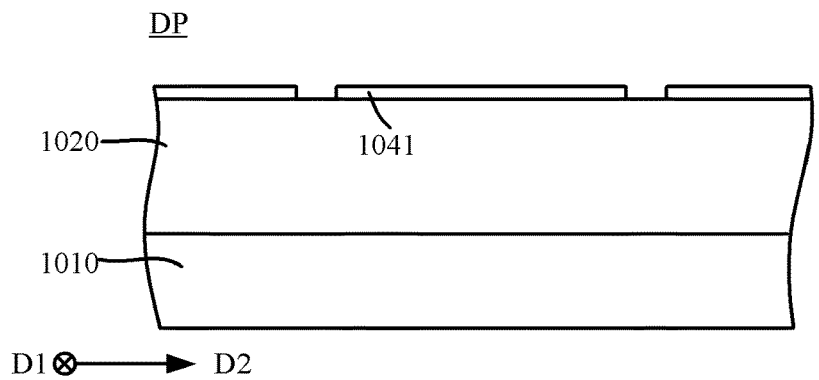

In step 910, the first conductive layer is patterned to form a plurality of first electrodes. As shown in FIG. 10A, a passivation layer 1020 is formed on the base substrate 1010 to cover the electronic components (for example, the transistors Ts and Td and the capacitor Cst shown in FIG. 4) in the pixel circuit, and the first conductive layer 1041 is formed on the passivation layer 1020. The first conductive layer 1041 is made of, for example, ITO. As shown in FIG. 10B, the first conductive layer 1041 is patterned into a plurality of first electrodes, and the first electrodes are arranged in an array in the first direction D1 and the second direction D2 to correspond to respective sub-pixel regions. This can be achieved by any suitable means, such as photolithography or laser etching.

Figure 10C:
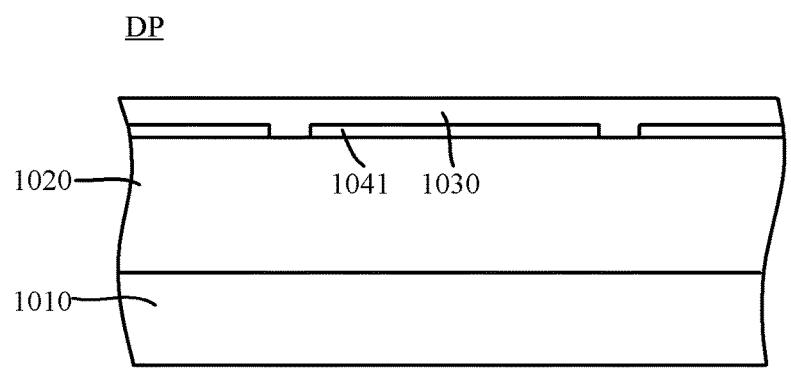

In step 920, a pixel defining layer is formed on the patterned first conductive layer. As shown in FIG. 10C, a pixel defining layer 1030 is formed on the patterned first conductive layer 1041 to cover each first electrode.

Figure 10D:
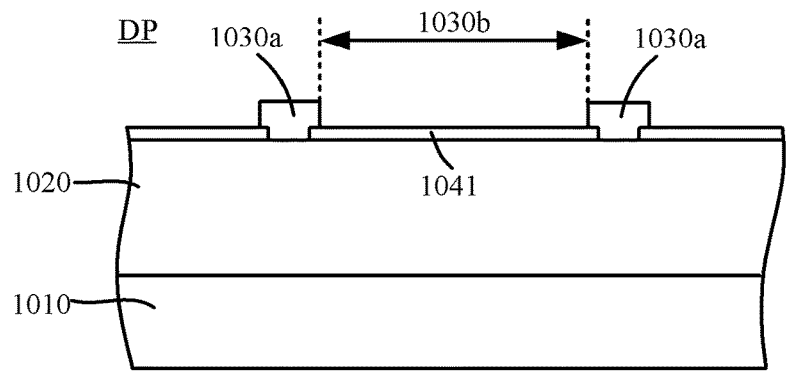

In step 930, the pixel defining layer is patterned to form a plurality of openings respectively exposing the plurality of first electrodes. As shown in FIG. 10D, the pixel defining layer 1030 is patterned to form a plurality of openings 1030b exposing a corresponding one of the respective first electrodes 1041, wherein each opening 1030b exposes at least a part of the corresponding first electrode 1041. The first plurality of first electrodes among the first electrodes 1041 are respectively exposed by the first plurality of first openings of the plurality of openings 1030b, and the second plurality of first electrodes among the first electrodes 1041 are respectively exposed by the second plurality of second openings of the plurality of openings 1030b, and the third plurality of first electrodes among the first electrodes 1041 are respectively exposed by the third plurality of third openings among the plurality of openings 1030b.

This can be achieved by any suitable means, such as photolithography. In one example, a photoresist layer is first formed (by, for example, spin coating) on the pixel defining layer 1030 shown in FIG. 10C, and then ultraviolet light is irradiated through a photo mask plate having a pattern corresponding to the plurality of openings 1030*b*, causing a chemical reaction of the photoresist in the exposed region. Then, the photoresist in the exposed region is removed by development, so that the pattern of the photo mask plate is copied to the photoresist layer. Finally, the pattern is transferred to the pixel defining layer 1030 by etching, and the remaining photoresist is removed to obtain a patterned bank 1030*a* and openings 1030*b* separated by the bank 1030*a*, as shown in FIG. 10D.

In step 940, a plurality of first light emitting layers respectively covering the first openings, a plurality of second light emitting layers respectively covering the second openings, and a plurality of third light emitting layers respectively covering the third openings are formed.

The formation of the first light emitting layers is achieved by depositing the first light emitting material using the first vapor deposition mask plate. The first light emitting material is, for example, an organic light emitting material that emits blue light when excited. The formation of the second light emitting layer is achieved by depositing the second light emitting material using the second vapor deposition mask plate. The second light emitting material is, for example, an organic light emitting material that emits red light when excited. The formation of the third light emitting layer is achieved by depositing the third light emitting material using a third vapor deposition mask plate. The third light emitting material is, for example, an organic light emitting material that emits green light when excited.

Figure 10E:
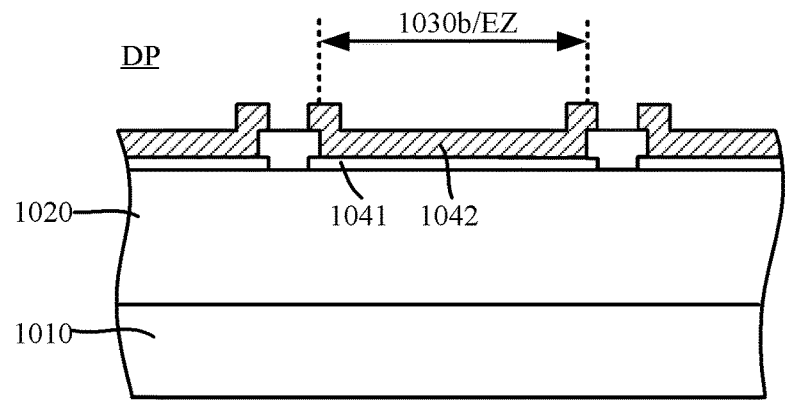

As shown in FIG. 10E, the light emitting layer 1042 is formed on the first electrode 1041 and covers the opening 1030*b*, and a region of the light emitting layer 1042 overlapping the opening 1030*b* forms a light emitting zone EZ. The light emitting layer 1042 represents any one of the first light emitting layer EL1, the second light emitting layer EL2, and the third light emitting layer EL3 described above with respect to FIG. 3A to FIG. 8B. In addition, the modification of the shape of the opening 1030*b* can be achieved by modifying the pattern of the photo mask plate when the pixel defining layer 1030 is patterned, so as to give the resultant light emitting zone EZ a desired contour.

Figure 10F:
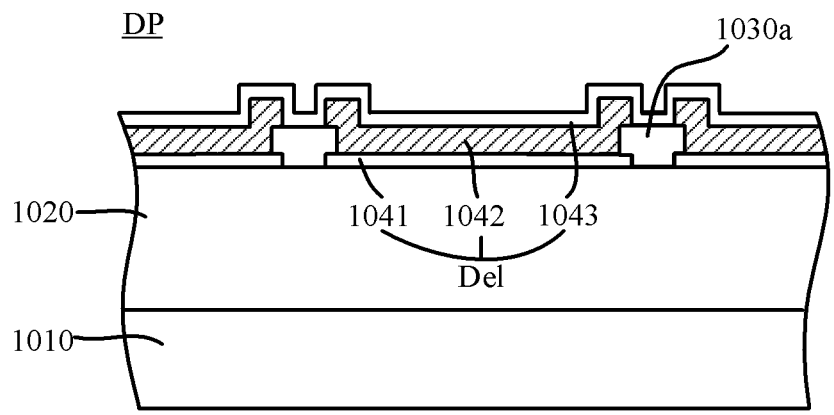

In step 950, a second conductive layer is formed on the first light emitting layer, the second light emitting layer, and the third light emitting layer. As shown in FIG. 10F, the second conductive layer 1043 is formed on the light emitting layers 1042. The second conductive layer 1043 may be made of, for example, aluminum. The first electrode 1041, the light emitting layer 1042, and the second electrode 1043 form a light emitting diode Del.

The method 900 provides the same advantages as those described above with respect to the display panel embodiments, which will not be repeated here.

Figure 11A:
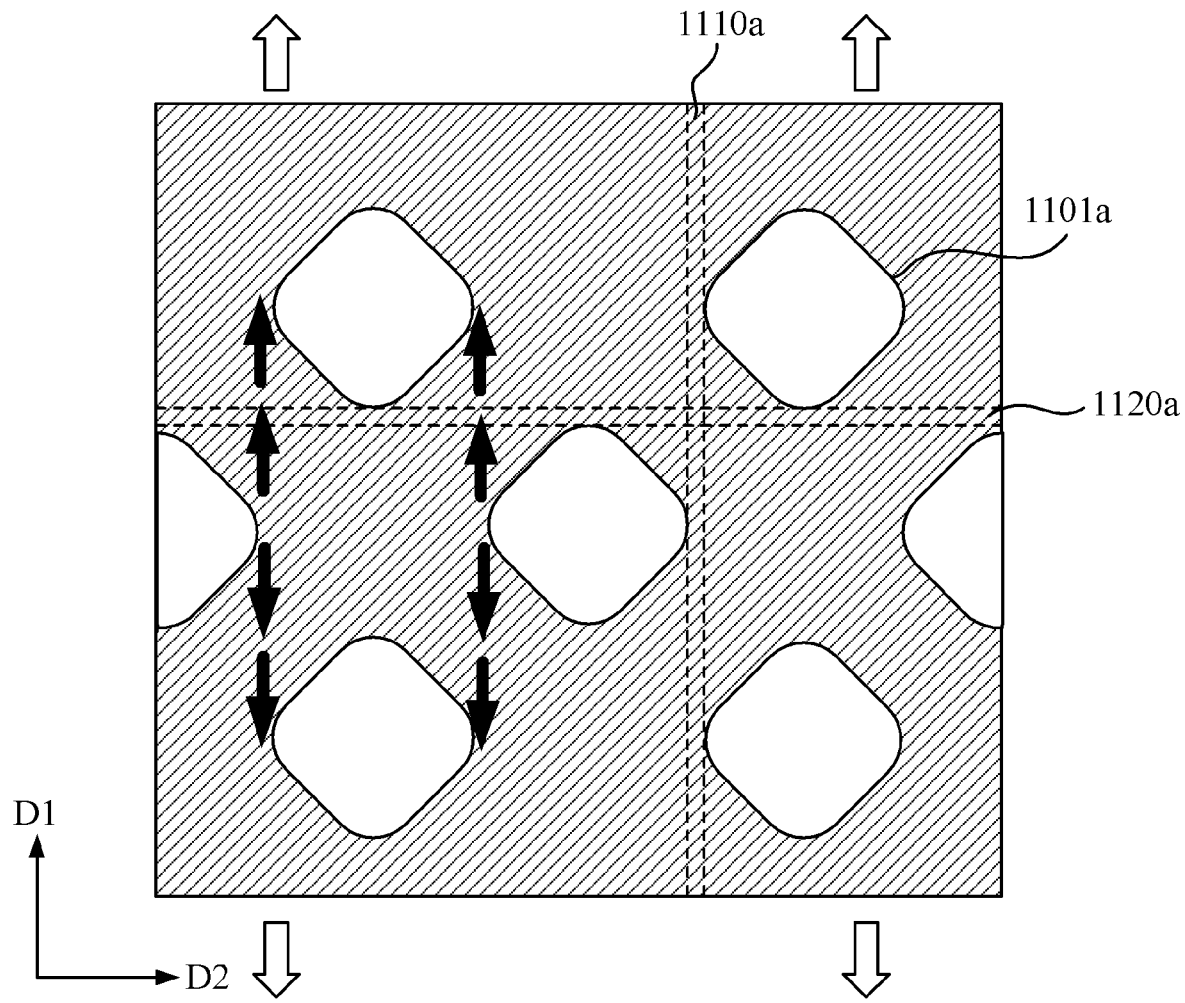
FIG. 11A and FIG. 11B schematically show plan views of a first mask plate and a second mask plate used to evaporate organic light emitting materials during the manufacturing process of the display panel of FIG. 3A according to an embodiment of the present disclosure.
Figure 11B:
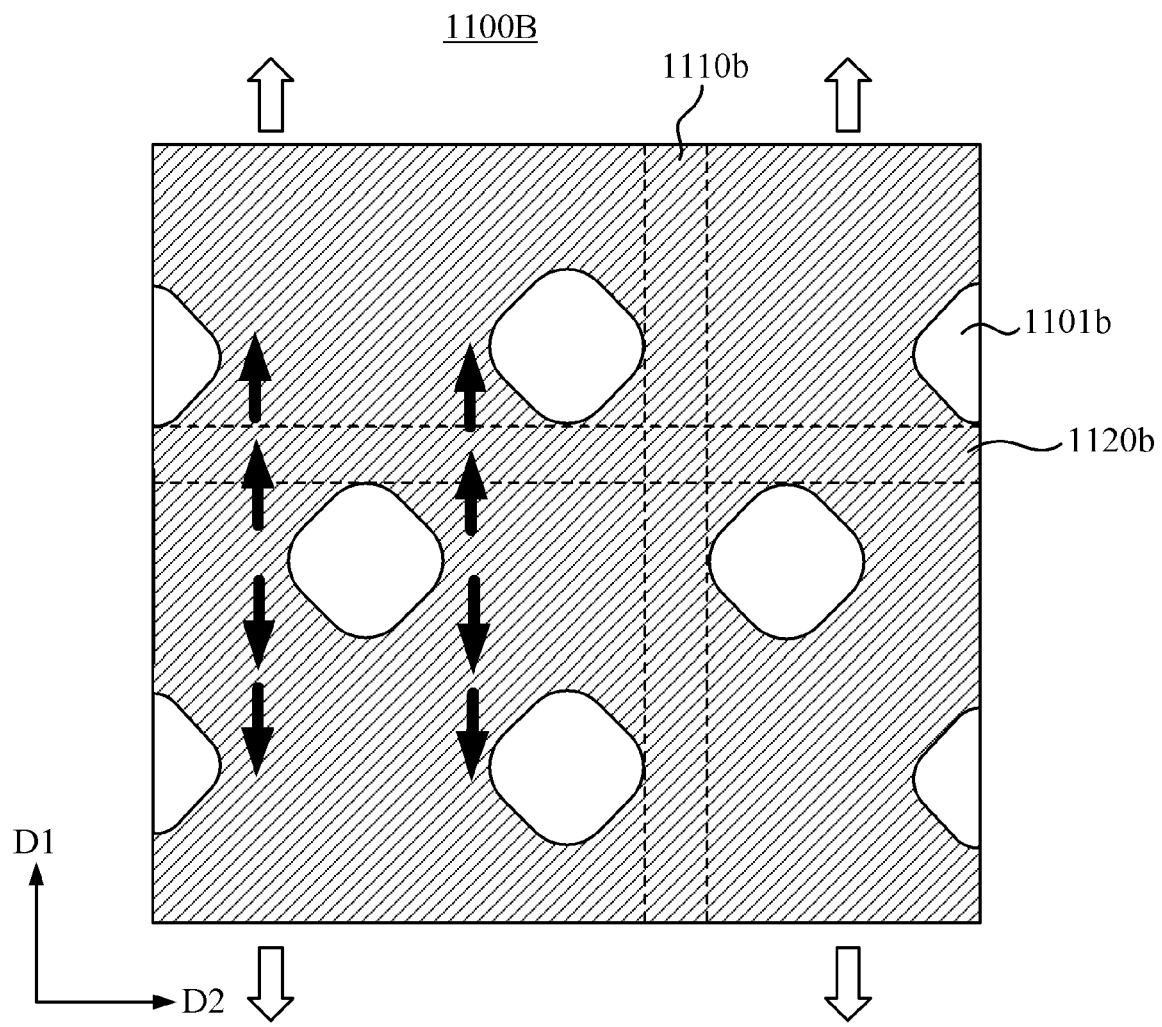

FIG. 11A and FIG. 11B schematically show plan views of a first mask plate 1100A and a second mask plate 1100B for depositing organic light emitting materials in the manufacturing process of the display panel DP of FIG. 3A according to an embodiment of the present disclosure.

Referring to FIG. 11A, the first mask plate 1100A is patterned into an array including first holes 1101*a*, each first hole 1101*a* includes two chamfered corners opposite to each other in the first direction D1 and two chamfered corners opposite to each other in the second direction D2 crossing the direction D1. In this embodiment, each corner of each first hole 1101*a* is rounded with a first radius, where the first radius is, for example, greater than or equal to 10 um. The first mask plate 1100A is used to form the pattern of the first light emitting layer EL1 in FIG. 3A.

Referring to FIG. 11B, the second mask plate 1100B is patterned into an array including second holes 1101*b*. Each second hole 1101*b* includes two chamfered corners opposite to each other in the first direction D1 and two chamfered corners opposite to each other in the second direction D2. In this embodiment, each corner of each second hole 1101*b* is rounded with a second radius, where the second radius is, for example, greater than or equal to 10 um. The second mask plate 1100B is used to form the pattern of the second light emitting layer EL2 in FIG. 3A.

Figure 11C:
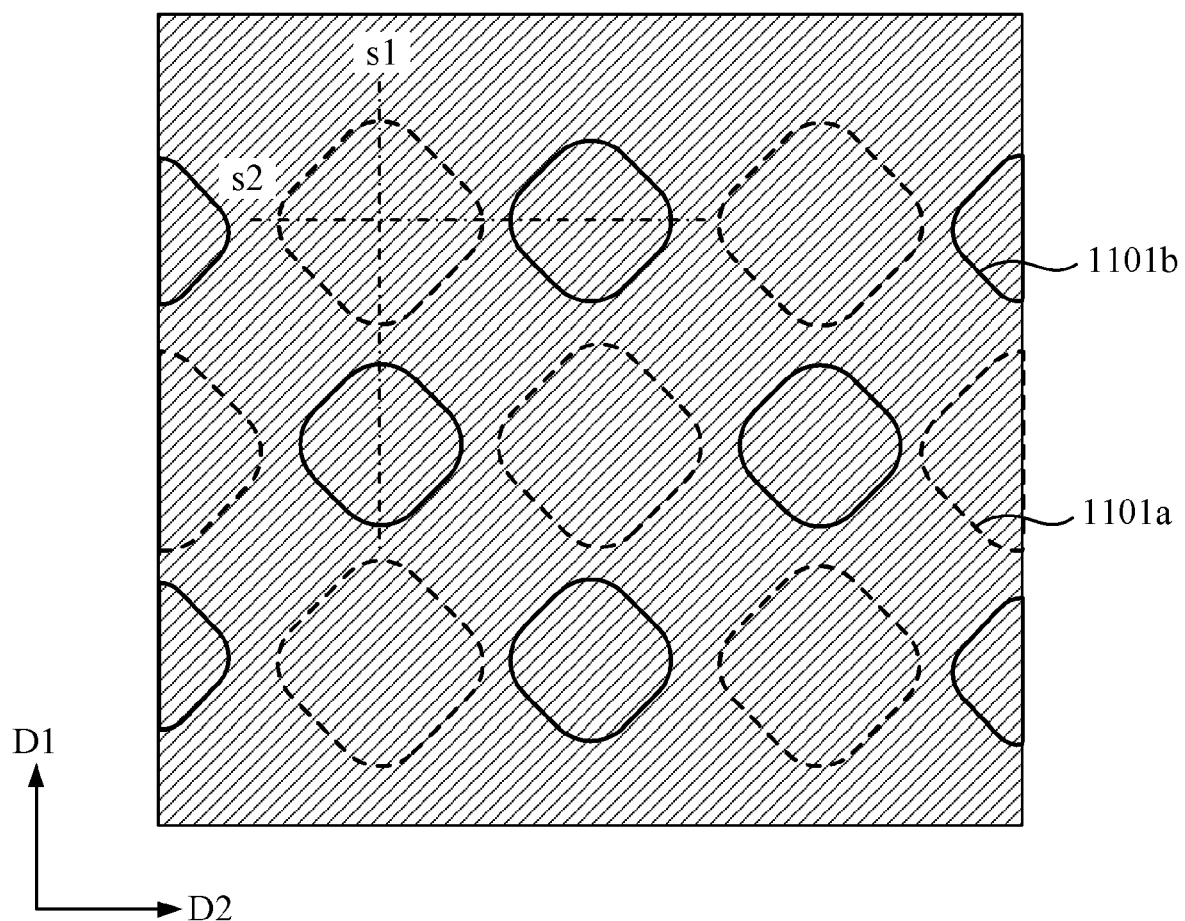
FIG. 11C schematically shows a schematic diagram of stacking and aligning the first mask plate and the second mask plate in FIG. 11A and FIG. 11B.

FIG. 11C schematically shows a schematic diagram in which the first mask plate 1100A and the second mask plate 1100B in FIGS. 11A and 11B are stacked and aligned with each other.

Referring to FIG. 11C, the second mask plate 1100B is stacked on the first mask plate 1100A. Each of the first holes 1101*a* and the second holes 1101*b* are respectively positioned in the first mask plate 1100A and the second mask plate 1100B so that when the first mask plate 1100A and the second mask plate 1100B are stacked and aligned with each other, the first holes 1101*a* and the second holes 1101*b* are alternately arranged in the first direction D1 and the second direction D2 and do not overlap each other. This makes it possible to realize the arrangement of the first light emitting layer EL1 and the second light emitting layer EL2 shown in FIG. 3A.

In some embodiments, each of the first holes 1101*a* and the second holes 1101*b* are respectively positioned in the first mask plate 1100A and the second mask plate 1100B so that when the first mask plate 1100A and the second mask plate 1100B are stacked and aligned with each other, the geometric center of each first hole 1101*a* and the geometric center of the corresponding second hole 1101*b* directly adjacent to the first hole 1101*a* in the first direction D1 are located on a straight line s1 parallel to the first direction D1, and the geometric center of each first hole 1101*a* and the geometric center of the corresponding second hole 1101*b* directly adjacent to the first hole 1101*a* in the second direction D2 are located on a straight line s2 parallel to the second direction D2.

In some embodiments, the two corners of each first hole 1101*a* opposite to each other in the second direction D2 are chamfered to provide non-perforated regions 1110*a* between the respective first holes 1101*a*. Each non-perforated region 1110*a* includes a first straight portion extending in a straight line in the first direction D1 without bending, and the length of the first straight portion along the first direction D1 is substantially the same as the size of the first mask plate 1100A in the first direction D1, as shown in FIG. 11A. This allows the conductive path of the stretching force (as indicated by the hollow arrow) inside the first mask plate 1100A to follow these non-perforated regions 1110*a* (as indicated by the solid arrow) when the first mask plate 1100A is tensioned by the stretching force, so as to avoid each first hole 1101*a*. Alternatively or additionally, an non-perforated region 1120*a* is provided between the first holes 1101*a*, the non-perforated region 1120*a* includes a third straight portion extending in a straight line in the second direction D2 without any bending, and the third straight portion has a length in the second direction D2 that is substantially the same as the size of the first mask plate 1100A in the second direction D2. This is beneficial to improve the spreading effect of the first mask plate 1100A, thereby improving the resultant position accuracy and dimensional accuracy of the first light emitting layer EL 1. Moreover, the chamfered holes also reduce the area of the perforated regions and improve the mechanical strength of the mask plate.

Similarly, the two corners of each second hole 1101b facing each other in the second direction D2 are chamfered to provide an non-perforated region 1110b between the respective second holes 1101b. Each non-perforated region 1110b includes a second straight portion extending in a straight line in the first direction D1 without any bending, and the length of the second straight portion along the first direction D1 is substantially the same as the size of the second mask plate 1100B in the direction D1, as shown in FIG. 11B. This allows the conductive path of the stretching force (as indicated by the hollow arrow) inside the second mask plate 1100B to follow these non-perforated regions 1110b (as indicated by the solid arrow) when the second mask plate 1100B is tensioned by the stretching force, so as to avoid the second holes 1101b. Alternatively or additionally, a non-perforated region 1120b is provided between the second holes 1101b. The non-perforated region 1120b includes a fourth straight portion extending in a straight line in the second direction D2 without any bending, and the fourth straight portion has a length along the second direction D2 that is substantially the same as the size of the second mask plate 1100B in the second direction D2. This is beneficial to improve the spreading effect of the second mask plate 1100B, thereby improving the resultant position accuracy and dimensional accuracy of the second light emitting layer EL2.

Figure 12A:
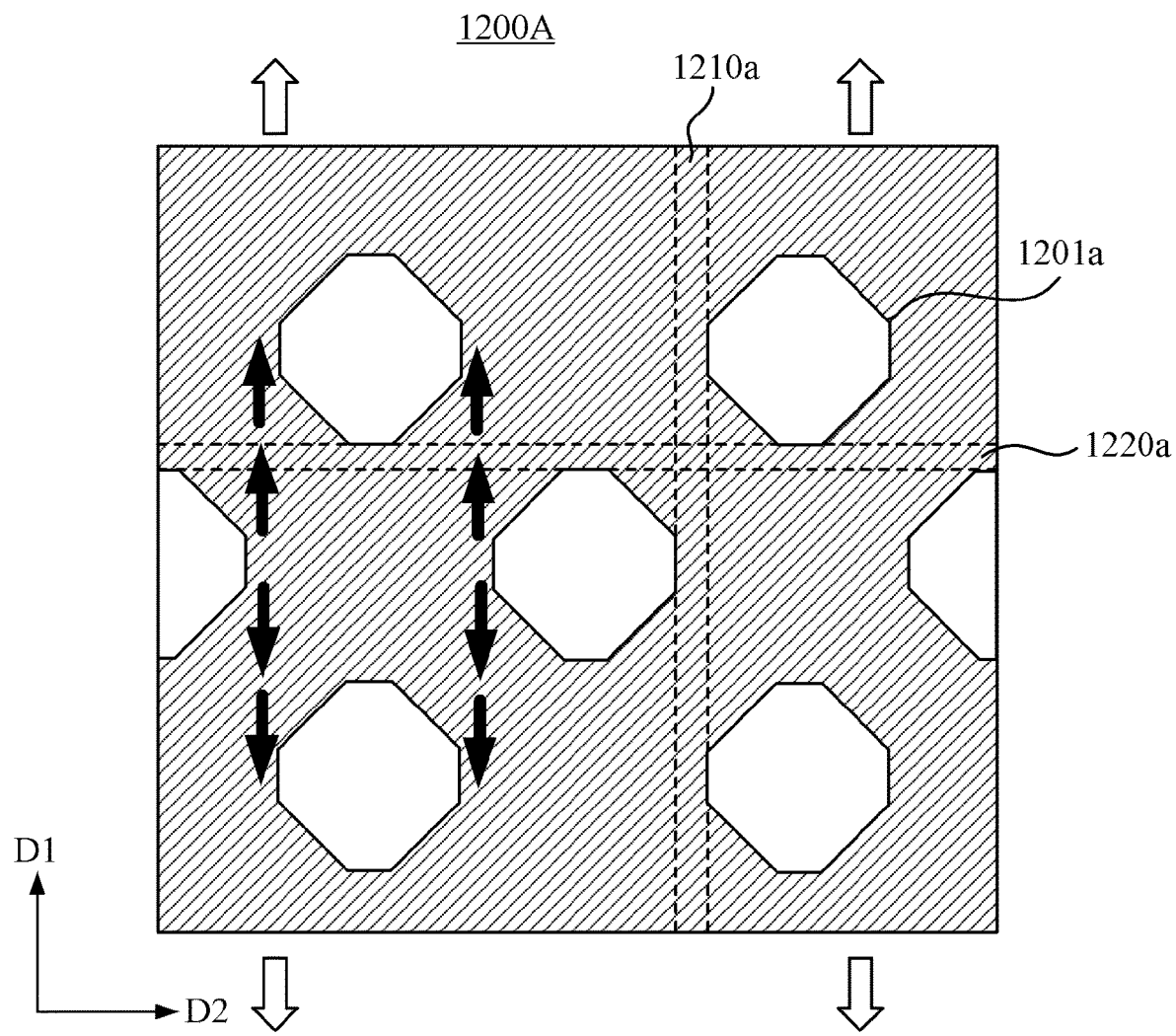
FIG. 12A and FIG. 12B schematically show plan views of a first mask plate and a second mask plate for evaporating organic light emitting materials in the manufacturing process of the display panel of FIG. 6 according to an embodiment of the present disclosure.
Figure 12B:
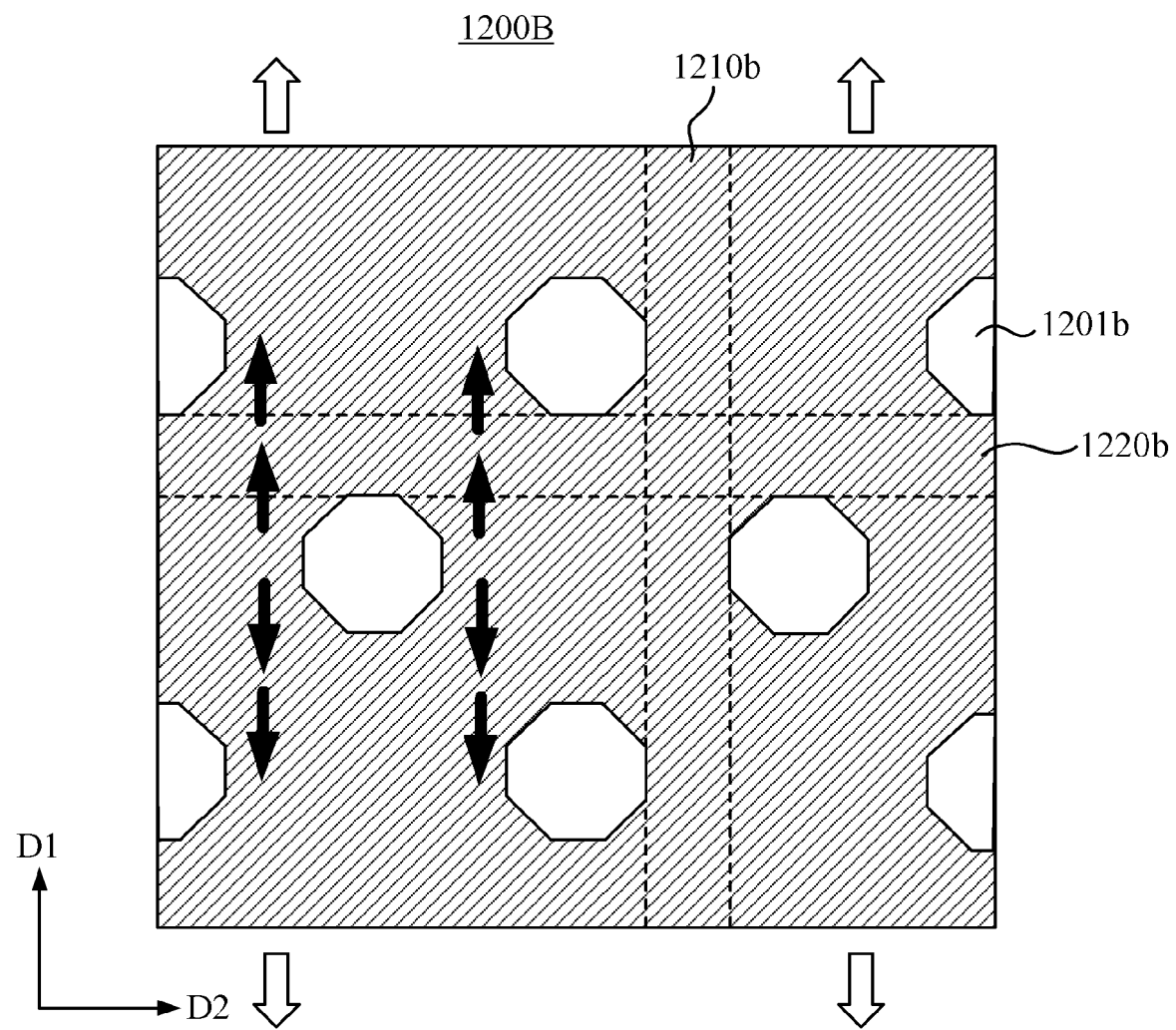

FIG. 12A and FIG. 12B schematically show plan views of a first mask plate 1200A and a second mask plate 1200B used for depositing organic light emitting materials during the manufacturing process of the display panel DP of FIG. 6 according to an embodiment of the present disclosure.

Referring to FIG. 12A, the first mask plate 1200A is patterned to include an array of first holes 1201a. Each of the first holes 1201a includes two chamfered corners opposite to each other in the first direction D1 and two chamfered corners opposite to each other in the second direction D2 crossing the direction D1. In this embodiment, each corner of each first hole 1201a is chamfered. The first mask plate 1200A is used to form the pattern of the first light emitting layer EL1 in FIG. 6.

Referring to FIG. 12B, the second mask plate 1200B is patterned to include an array of second holes 1201b. Each second hole 1201b includes two chamfered corners opposite to each other in the first direction D1 and two chamfered corners opposite to each other in the second direction D2. In this embodiment, each corner of each second hole 1201b is chamfered. The second mask plate 1200B is used to form the pattern of the second light emitting layer EL2 in FIG. 6.

The first mask plate 1200A and the second mask plate 1200B may have the same configurations as those of the first mask plate 1100A and the second mask plate 1100B in other aspects. For example, the non-perforated regions 1210a and 1220a are provided among the first holes 1201a, and the non-perforated regions 1210b and 1220b are provided among the second holes 1201b. This provides the same advantages as those described above with respect to FIG. 11A and FIG. 11B.

Figure 12C:
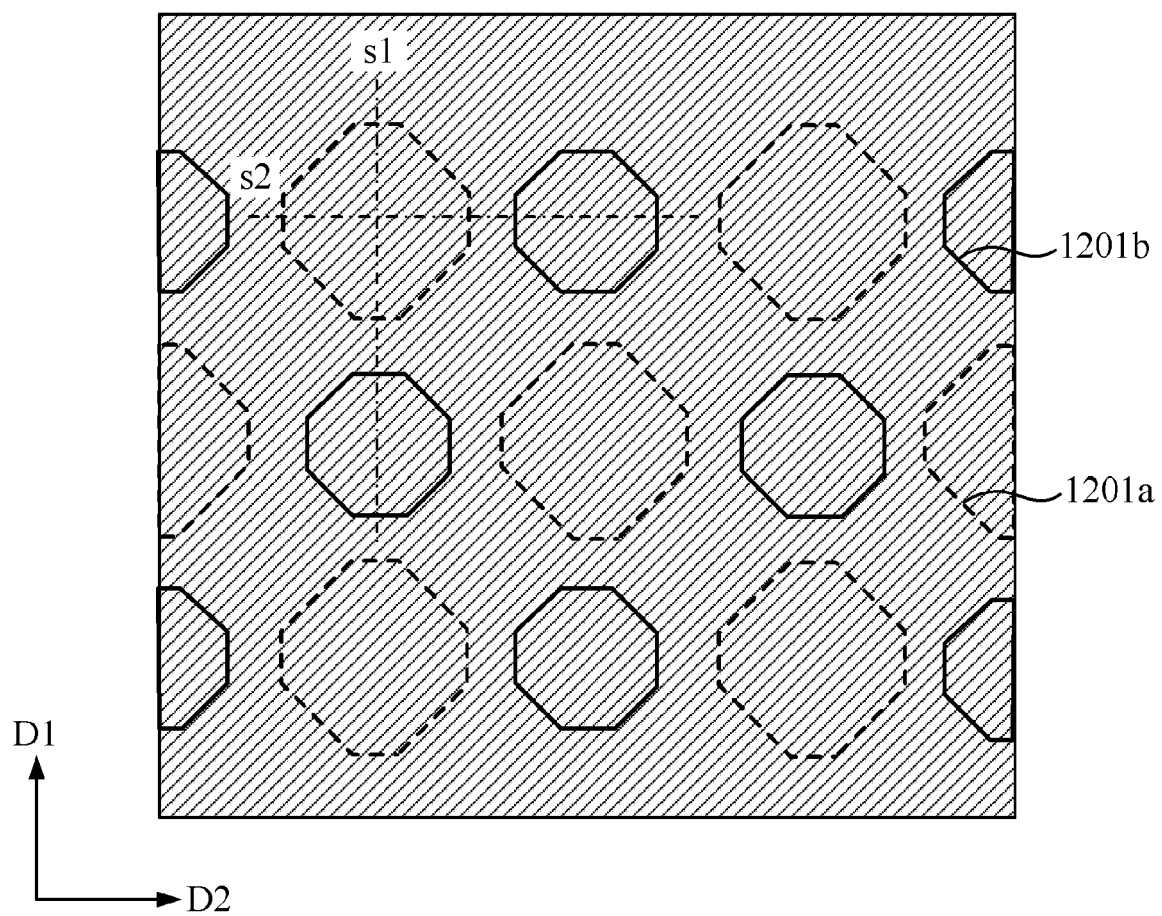
FIG. 12C schematically shows a schematic diagram of stacking and aligning the first mask plate and the second mask plate in FIG. 12A and FIG. 12B.

FIG. 12C schematically shows a schematic diagram of the first mask plate 1200A and the second mask plate 1200B in FIG. 12A and FIG. 12B being stacked and aligned with each other.

Referring to FIG. 12C, the second mask plate 1200B is stacked on the first mask plate 1200A. The first holes 1201a and the second holes 1201b are respectively positioned in the first mask plate 1200A and the second mask plate 1200B so that when the first mask plate 1200A and the second mask plate 1200B are stacked and aligned with each other, the first holes 1201a and the second holes 1201b are alternately arranged in the first direction D1 and the second direction D2 and do not overlap each other. This makes it possible to realize the arrangement of the first light emitting layer EL1 and the second light emitting layer EL2 shown in FIG. 6.

In some embodiments, the first holes 1201a and the second holes 1201b are respectively positioned in the first mask plate 1200A and the second mask plate 1200B so that when the first mask plate 1200A and the second mask plate 1200B are stacked and aligned with each other, the geometric center of each first hole 1201a and the geometric center of the corresponding second hole 1201b directly adjacent to the first hole 1201a in the first direction D1 are located on a straight line s1 parallel to the first direction D1, and the geometric center of each first hole 1201a and the geometric center of the corresponding second hole 1201b directly adjacent to the first hole 1201a in the second direction D2 are located on a straight line s2 parallel to the second direction D2.

Figure 13:
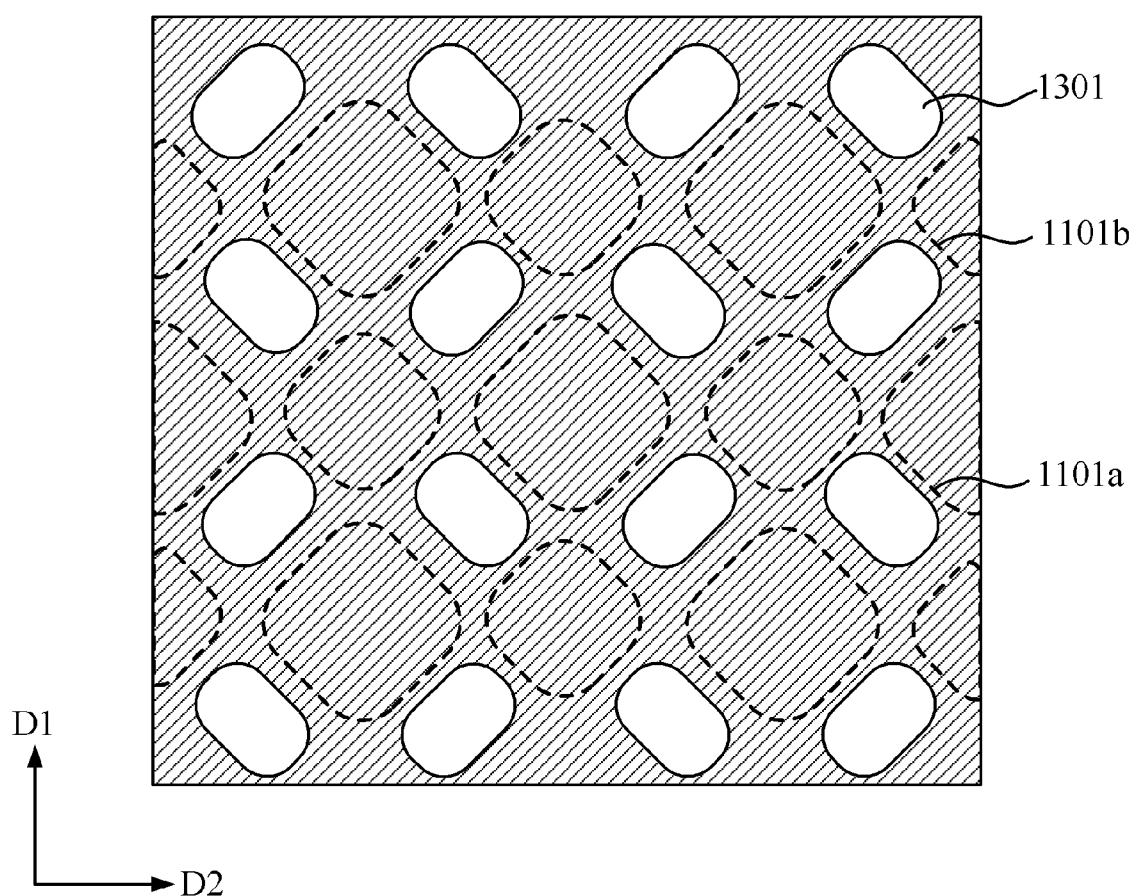
FIG. 13 schematically shows a plan view of a third mask plate for evaporating organic light emitting materials in the manufacturing process of the display panel of FIG. 7 according to an embodiment of the present disclosure.

FIG. 13 schematically shows a plan view of a third mask plate 1300 for depositing organic light emitting materials in the manufacturing process of the display panel DP of FIG. 7 according to an embodiment of the present disclosure.

Referring to FIG. 13, the third mask plate 1300 is patterned to include an array of third holes 1301. Each of the third through holes 1301 has a shape of a polygon with rounded corners. In this embodiment, each third hole 1301 has a shape of a rectangular with rounded corners. The third mask plate 1300 is not required to have holes with sharp corners, which helps to alleviate or eliminate the poor etching accuracy at the sharp corners caused by the etching load.

The third mask plate 1300 is used to form the pattern of the third light emitting layer EL3 in FIG. 7. For this purpose, each third hole 1301 is positioned in the third mask plate 1300 so that when the first mask plate and the second mask plate (for example, 1100A and 1100B) and the third mask plate 1300 are stacked and aligned with one another, each third hole 1301 is provided between each of the first hole and the second hole (for example, 1101a and 1101b indicated by a dotted line in FIG. 13). In this way, when the first light emitting material, the second light emitting material, and the third light emitting material are vapor-deposited on the substrate through the first mask plate 1100A, the second mask plate 1100B, and the third mask plate 1300, respectively, the patterns of the first light emitting layer EL1, the second light emitting layer EL2, and the third light emitting layer EL3 as shown in FIG. 7 are obtained.

In some embodiments, the third mask plate 1300 may be used in combination with the first mask plate 1200A and the second mask plate 1200B to obtain the pattern that is the combination of the first light emitting layer EL1 and the second light emitting layer EL2 shown in FIG. 6 and the third light emitting layer EL3 shown in FIG. 7.

In some embodiments, each third hole 1301 may have a shape of another polygon with rounded corners to obtain the third light emitting layer EL3 having a corresponding shape.

Although the foregoing discussion contains several specific implementation details, these should not be construed as limitations on any disclosure or the scope of protection that may be claimed, but as a description of features that may be limited to specific embodiments of the specific disclosure. Certain features described in different embodiments in this specification can also be implemented in combination in a single embodiment. In contrast, different features described in a single embodiment can also be implemented in multiple embodiments separately or in any suitable subcombination form. For example, some of the first sub-pixel regions and the second sub-pixel regions may have the configuration described with respect to FIG. 3A, and some of the first sub-pixel regions and the second sub-pixel regions may have the configuration described with respect to FIG. 6. For another example, some of the corners of the same light emitting layer may be rounded, and some of the corners may be chamfered as flat corners. Similarly, although the various operations are described in a specific order in the drawings, this should not be construed as requiring that these operations must be performed in the specific order shown, nor should it be construed as requiring all shown operations to be performed to obtain the desired result.

In view of the foregoing description and reading the accompanying drawings, various modifications and changes to the foregoing exemplary embodiments of the present disclosure may become clear to those skilled in the relevant art. Any and all modifications will still fall within the scope of the non-limiting and exemplary embodiments of this disclosure. In addition, those skilled in the art to which these embodiments of the present disclosure belong will come to other embodiments of the present disclosure described herein from the teachings given in the foregoing description and related drawings.

What is claimed is:

1. A display panel, including:
a plurality of first light emitting layers configured to emit a light of a first color when excited;
a plurality of second light emitting layers configured to emit a light of a second color when excited;
a plurality of third light emitting layers configured to emit a light of a third color when excited;
a pixel definition layer which includes:
a plurality of first openings covered by corresponding first light emitting layers, the plurality of first openings overlapping with corresponding regions of the corresponding first light emitting layers to define respective first light emitting zones of the plurality of first light emitting layers;
a plurality of second openings covered by the corresponding second light emitting layers, the plurality of second openings overlapping with corresponding regions of the corresponding second light emitting layers to define respective second light emitting zones of the plurality of second light emitting layers; and
a plurality of third openings covered by corresponding third light emitting layers, and the plurality of third openings overlapping with corresponding regions of the corresponding third light emitting layers to define respective third light emitting zones of the plurality of third light emitting layers,
wherein the first light emitting layers and the second light emitting layers are alternately arranged in a first direction and a second direction crossing the first direction, and the third light emitting layers are arranged between the first light emitting layers and the second light emitting layers, and
each of the first light emitting layers and the second light emitting layers includes corners, the corners are chamfered so that the first light emitting layer and the second light emitting layer do not overlap each other, the corners including two first corners opposite to each other in the first direction and two second corners opposite to each other in the second direction,
wherein a distance from any point on an edge of each of the first corner and the second corner of each first light emitting layer to the corresponding first light emitting zone is greater than or equal to a misalignment tolerance value, the misalignment tolerance value being a minimum distance of distances between any point on a straight edge of the first light emitting layer or the second light emitting layer and any point on a straight edge of the first light emitting zone or the second light emitting zone, respectively,
a distance from any point on the edge of each of the first corner and the second corner of each second light emitting layer to the corresponding second light emitting zone is greater than or equal to the misalignment tolerance value,
each third light emitting layer has a shape of a polygon with rounded corners, and each third light emitting zone has a shape conforming to the shape of the corresponding third light emitting layer, a minimum distance from any point on an edge of the corresponding third light emitting layer to a boundary of the third light emitting zone being substantially equal to the misalignment tolerance value, and
wherein the first light emitting layer and the second light emitting layer both at least partly contact with the third light emitting layer, and there is an interval in both the first direction and the second direction between each second light emitting layer and the adjacent first light emitting layer.

2. The display panel of claim 1,
wherein one of the two first corners of each first light emitting layer is directly adjacent to one of the two first corners of the corresponding second light emitting layer, the corresponding second light emitting layer being directly adjacent to the first light emitting layer in the first direction, and
wherein a distance between the first corner of the first light emitting layer and the first corner of the corresponding second light emitting layer is a minimum distance of distances between any first point in the first light emitting layer and any second point in the corresponding second light emitting layer.

3. The display panel of claim 2,
wherein two sides of the first corner forming the first light emitting layer include respective straight portions, and respective imaginary extension lines of the straight portions intersect to form a first virtual corner,
two sides of the first corner forming the corresponding second light emitting layer include respective straight portions, and respective imaginary extension lines of the straight portions intersect to form a second virtual corner, and
the first virtual corner and the second virtual corner partially overlap.

4. The display panel of claim 1,
wherein one of the two second corners of each first light emitting layer is directly adjacent to one of the two second corners of the corresponding second light emitting layer, the corresponding second light emitting layer being directly adjacent to the first light emitting layer in the second direction, and
a distance between the second corner of the first light emitting layer and the second corner of the corresponding second light emitting layer is a minimum distance of distances between any first point in the first light emitting layer and any second point in the corresponding second light emitting layer.

5. The display panel of claim 4,
wherein two sides of the second corner forming the first light emitting layer include respective straight portions, and respective imaginary extension lines of the straight portions intersect to form a third virtual corner,
two sides of the second corner forming the corresponding second light emitting layer include respective straight portions, and respective imaginary extension lines of the straight portions intersect to form a fourth virtual corner, and
the third virtual corner and the fourth virtual corner partially overlap.

6. The display panel of claim 1, wherein the first corner and the second corner of each first light emitting layer are flat chamfered or rounded chamfered with a first radius.

7. The display panel of claim 6, wherein the first radius is greater than or equal to 10 um.

8. The display panel of claim 1, wherein the first corner and the second corner of each second light emitting layer are flat chamfered or rounded chamfered with a second radius.

9. The display panel of claim 8, wherein the second radius is greater than or equal to 10 um.

10. The display panel of claim 1, wherein the first light emitting layer, the second light emitting layer, and the third light emitting layer are arranged to form a plurality of repeating units repeatedly arranged in the first direction and the second direction, each repeating unit includes two first light emitting layers, two second light emitting layers and four third light emitting layers, wherein
the two first light emitting layers are respectively arranged in an ith row and a (j+2)th column, and an (i+2)th row and a jth column, the two second light emitting layers are respectively arranged in the ith row and the jth column, and the (i+2)th row and the (j+2)th column, and the four third light emitting layers are respectively arranged in an (i+1)th row and a (j+1)th column, the (i+1)th row and a (j+3)th column, an (i+3)th row and the (j+1)th column, and the (i+3)th row and the (j+3)th column, where i and j are integers greater than zero.

11. The display panel of claim 10,
wherein the first direction is substantially perpendicular to the second direction,
each of the first light emitting layers has a shape obtained by chamfering each of four corners of a first square, and first and second diagonals of the first square are respectively parallel to the first and the second directions,
each of the second light emitting layers has a shape obtained by chamfering each of four corners of a second square, and first and second diagonals of the second square are respectively parallel to the first and the second directions, and
each of the third light emitting layers has a shape obtained by rounding each of four corners of a rectangle, and a long side of the rectangle faces a side of the corresponding first light emitting layer directly adjacent to the third light emitting layer and is substantially parallel to the side of the corresponding first light emitting layer, and a short side of the rectangle faces a side of the corresponding second light emitting layer directly adjacent to the third light emitting layer and is substantially parallel to the side of the corresponding second light emitting layer.

12. The display panel according to claim 1,
wherein a geometric center of each first light emitting layer and a geometric center of the corresponding second light emitting layer directly adjacent to the first light emitting layer in the first direction are located on a straight line parallel to the first direction, and
the geometric center of each first light emitting layer and a geometric center of the corresponding second light emitting layer directly adjacent to the first light emitting layer in the second direction are located on a straight line parallel to the second direction.

13. A method of manufacturing a display panel, including:
patterning a first conductive layer to form a plurality of first electrodes, wherein the first electrodes are arranged in an array in a first direction and a second direction crossing the first direction;
forming a pixel defining layer on the patterned first conductive layer;
patterning the pixel defining layer to form a plurality of openings respectively exposing the plurality of the first electrodes, wherein each opening exposes at least a part of the corresponding first electrode, and a first plurality of the first electrodes among the plurality of the first electrodes are respectively exposed by a plurality of first openings among the plurality of the openings, and a second plurality of the first electrodes among the plurality of the first electrodes are respectively exposed by a plurality of second openings among the plurality of the openings, and a third plurality of the first electrodes of the plurality of the first electrodes are respectively exposed by a plurality of third openings of the plurality of the openings;
forming a plurality of first light emitting layers respectively covering the first openings, a plurality of second light emitting layers respectively covering the second openings, and a plurality of third light emitting layers respectively covering the third openings; and
forming a second conductive layer on the first light emitting layer, the second light emitting layer and the third light emitting layer,
wherein the first light emitting layers and the second light emitting layers are alternately arranged in the first direction and the second direction, and each third light emitting layer is disposed between the first light emitting layer and the second light emitting layer, and
each of the first light emitting layer and the second light emitting layer includes corners, and the corners are chamfered so that the first light emitting layer and the second light emitting layer do not overlap each other, the corners including two first corners opposite to each other in the first direction and two second corners opposite to each other in the second direction,
the plurality of first openings overlapping with corresponding regions of the corresponding first light emitting layers to define respective first light emitting zones of the plurality of first light emitting layers, the plurality of second openings overlapping with corresponding regions of the corresponding second light emitting layers to define respective second light emitting zones of the plurality of second light emitting layers, the plurality of third openings overlapping with corresponding regions of the corresponding third light emitting layers to define respective third light emitting zones of the plurality of third light emitting layers,
wherein a distance from any point on an edge of each of the first corner and the second corner of each first light emitting layer to the corresponding first light emitting zone is greater than or equal to a misalignment tolerance value, the misalignment tolerance value being a minimum distance of distances between any point on a straight edge of the first light emitting layer or the second light emitting layer and any point on a straight edge of the first light emitting zone or the second light emitting zone, respectively, a distance from any point on the edge of each of the first corner and the second corner of each second light emitting layer to the corresponding second light emitting zone is greater than or equal to the misalignment tolerance value, each third light emitting layer has a shape of a polygon with rounded corners, and each third light emitting zone has a shape conforming to the shape of the corresponding third light emitting layer, a minimum distance from any point on an edge of the corresponding third light emitting layer to a boundary of the third light emitting zone being substantially equal to the misalignment tolerance value, and wherein the first light emitting layer and the second light emitting layer both at least partly contact with the third light emitting layer, and there is an interval in both the first direction and the second direction between each second light emitting layer and the adjacent first light emitting layer.

\* \* \* \* \*